United States Patent
Parikh et al.

(10) Patent No.: US 10,306,051 B2
(45) Date of Patent: May 28, 2019

(54) MANAGING ENERGY USAGE IN MOBILE DEVICES

(71) Applicant: Hand Held Products, Inc., Fort Mill, SC (US)

(72) Inventors: Chirant Parikh, Central City, IA (US); Michael Ehler, Iowa City, IA (US); Mark Howe, Cedar Rapids, IA (US)

(73) Assignee: Hand Held Products, Inc., Fort Mill, SC (US)

( * ) Notice: Subject to any disclaimer, the term of this patent is extended or adjusted under 35 U.S.C. 154(b) by 0 days.

(21) Appl. No.: 15/613,369

(22) Filed: Jun. 5, 2017

(65) Prior Publication Data
US 2017/0358940 A1    Dec. 14, 2017

Related U.S. Application Data

(60) Provisional application No. 62/349,687, filed on Jun. 14, 2016.

(51) Int. Cl.
*H04M 1/72* (2006.01)
*H04M 1/02* (2006.01)
(Continued)

(52) U.S. Cl.
CPC .... *H04M 1/72569* (2013.01); *G01R 31/3842* (2019.01); *G01R 31/44* (2013.01);
(Continued)

(58) Field of Classification Search
CPC ........... H04M 1/72569; H04M 1/0264; H04M 1/0266; G06F 1/206; G06F 1/3215; G06F 1/3212; G06F 1/1684; H04W 52/028
(Continued)

(56) References Cited

U.S. PATENT DOCUMENTS

| | | | | |
|---|---|---|---|---|
| 5,913,068 A | * | 6/1999 | Matoba | G06F 1/3203 713/322 |
| 5,955,869 A | * | 9/1999 | Rathmann | G01R 31/3648 320/132 |

(Continued)

FOREIGN PATENT DOCUMENTS

| | | |
|---|---|---|
| CN | 105554928 A | 5/2016 |
| EP | 2051157 A1 | 4/2009 |

(Continued)

OTHER PUBLICATIONS

US 8,616,454 B2, 12/2013, Havens et al. (withdrawn)
(Continued)

*Primary Examiner* — M Baye Diao
(74) *Attorney, Agent, or Firm* — Alston & Bird LLP

(57) ABSTRACT

A battery powered mobile device has battery monitoring circuit that measures one or more parameters indicative of a current state of the battery. A plurality of operational systems and processes form a part of the mobile device. A programmed processor is programmed to carry out a process that includes: determining a current state of the battery by receiving data representing the one or more parameters from the battery monitoring circuit indicative of the current state of the battery; calculating a battery power factor as a function of the parameter; comparing the battery power factor to a threshold; when the battery power factor exceeds the threshold, identifying a system or process within the mobile device whose power consumption can be reduced; and reducing the power consumption by altering or disabling the identified system or process.

20 Claims, 11 Drawing Sheets

(51) Int. Cl.
- *H02J 7/00* (2006.01)
- *H04M 1/725* (2006.01)
- *H05B 1/02* (2006.01)
- *H04W 4/04* (2009.01)
- *G06F 1/3206* (2019.01)
- *G01R 31/3842* (2019.01)
- *H04W 52/02* (2009.01)
- *H05B 3/84* (2006.01)
- *G01R 31/44* (2006.01)
- *G06F 1/16* (2006.01)
- *G06F 1/20* (2006.01)
- *G06F 1/3212* (2019.01)
- *G06F 1/3215* (2019.01)
- *H04W 4/33* (2018.01)

(52) U.S. Cl.
CPC ............ *G06F 1/1684* (2013.01); *G06F 1/206* (2013.01); *G06F 1/3206* (2013.01); *G06F 1/3212* (2013.01); *G06F 1/3215* (2013.01); *H02J 7/0063* (2013.01); *H04M 1/0264* (2013.01); *H04M 1/0266* (2013.01); *H04W 4/043* (2013.01); *H04W 4/33* (2018.02); *H04W 52/028* (2013.01); *H05B 1/0227* (2013.01); *H05B 3/84* (2013.01); *H02J 2007/0067* (2013.01); *H04M 2250/12* (2013.01); *H04W 52/0225* (2013.01); *Y02D 10/16* (2018.01); *Y02D 10/174* (2018.01); *Y02D 70/00* (2018.01); *Y02D 70/142* (2018.01); *Y02D 70/144* (2018.01); *Y02D 70/164* (2018.01); *Y02D 70/166* (2018.01); *Y02D 70/22* (2018.01); *Y02D 70/26* (2018.01)

(58) Field of Classification Search
USPC ........................................................ 320/136
See application file for complete search history.

(56) References Cited

U.S. PATENT DOCUMENTS

| | | | |
|---|---|---|---|
| 6,329,794 B1 * | 12/2001 | Oeda | H02J 1/14 320/130 |
| 6,331,762 B1 * | 12/2001 | Bertness | G01R 31/3648 320/134 |
| 6,612,493 B1 | 9/2003 | Degiovine et al. | |
| 6,678,538 B1 * | 1/2004 | Koizumi | H01M 10/48 455/574 |
| 6,813,897 B1 * | 11/2004 | Bash | F25B 27/00 307/64 |
| 6,832,725 B2 | 12/2004 | Gardiner et al. | |
| 7,128,266 B2 | 10/2006 | Zhu et al. | |
| 7,159,783 B2 | 1/2007 | Walczyk et al. | |
| 7,413,127 B2 | 8/2008 | Ehrhart et al. | |
| 7,726,575 B2 | 6/2010 | Wang et al. | |
| 7,848,776 B2 * | 12/2010 | Akiba | H04W 52/0277 455/552.1 |
| 7,908,064 B2 * | 3/2011 | Cawthorne | B60K 6/445 180/65.24 |
| RE42,284 E * | 4/2011 | Severson | A63H 19/10 104/DIG. 1 |
| 8,294,969 B2 | 10/2012 | Plesko | |
| 8,317,105 B2 | 11/2012 | Kotlarsky et al. | |
| 8,322,622 B2 | 12/2012 | Liu | |
| 8,366,005 B2 | 2/2013 | Kotlarsky et al. | |
| 8,371,507 B2 | 2/2013 | Haggerty et al. | |
| 8,376,233 B2 | 2/2013 | Van Horn et al. | |
| 8,381,979 B2 | 2/2013 | Franz | |
| 8,390,909 B2 | 3/2013 | Plesko | |
| 8,408,464 B2 | 4/2013 | Zhu et al. | |
| 8,408,468 B2 | 4/2013 | Horn et al. | |
| 8,408,469 B2 | 4/2013 | Good | |
| 8,424,768 B2 | 4/2013 | Rueblinger et al. | |
| 8,448,863 B2 | 5/2013 | Xian et al. | |
| 8,457,013 B2 | 6/2013 | Essinger et al. | |
| 8,459,557 B2 | 6/2013 | Havens et al. | |
| 8,469,272 B2 | 6/2013 | Kearney | |
| 8,474,712 B2 | 7/2013 | Kearney et al. | |
| 8,479,992 B2 | 7/2013 | Kotlarsky et al. | |
| 8,490,877 B2 | 7/2013 | Kearney | |
| 8,517,271 B2 | 8/2013 | Kotlarsky et al. | |
| 8,523,076 B2 | 9/2013 | Good | |
| 8,528,818 B2 | 9/2013 | Ehrhart et al. | |
| 8,544,737 B2 | 10/2013 | Gomez et al. | |
| 8,548,420 B2 | 10/2013 | Grunow et al. | |
| 8,550,335 B2 | 10/2013 | Samek et al. | |
| 8,550,354 B2 | 10/2013 | Gannon et al. | |
| 8,550,357 B2 | 10/2013 | Kearney | |
| 8,556,174 B2 | 10/2013 | Kosecki et al. | |
| 8,556,176 B2 | 10/2013 | Van Horn et al. | |
| 8,556,177 B2 | 10/2013 | Hussey et al. | |
| 8,559,767 B2 | 10/2013 | Barber et al. | |
| 8,561,895 B2 | 10/2013 | Gomez et al. | |
| 8,561,903 B2 | 10/2013 | Sauerwein | |
| 8,561,905 B2 | 10/2013 | Edmonds et al. | |
| 8,565,107 B2 | 10/2013 | Pease et al. | |
| 8,571,307 B2 | 10/2013 | Li et al. | |
| 8,579,200 B2 | 11/2013 | Samek et al. | |
| 8,583,924 B2 | 11/2013 | Caballero et al. | |
| 8,584,945 B2 | 11/2013 | Wang et al. | |
| 8,587,595 B2 | 11/2013 | Wang | |
| 8,587,697 B2 | 11/2013 | Hussey et al. | |
| 8,588,869 B2 | 11/2013 | Sauerwein et al. | |
| 8,590,789 B2 | 11/2013 | Nahill et al. | |
| 8,596,539 B2 | 12/2013 | Havens et al. | |
| 8,596,542 B2 | 12/2013 | Havens et al. | |
| 8,596,543 B2 | 12/2013 | Havens et al. | |
| 8,599,271 B2 | 12/2013 | Havens et al. | |
| 8,599,957 B2 | 12/2013 | Peake et al. | |
| 8,600,158 B2 | 12/2013 | Li et al. | |
| 8,600,167 B2 | 12/2013 | Showering | |
| 8,602,309 B2 | 12/2013 | Longacre et al. | |
| 8,608,053 B2 | 12/2013 | Meier et al. | |
| 8,608,071 B2 | 12/2013 | Liu et al. | |
| 8,611,309 B2 | 12/2013 | Wang et al. | |
| 8,615,487 B2 | 12/2013 | Gomez et al. | |
| 8,621,123 B2 | 12/2013 | Caballero | |
| 8,622,303 B2 | 1/2014 | Meier et al. | |
| 8,628,013 B2 | 1/2014 | Ding | |
| 8,628,015 B2 | 1/2014 | Wang et al. | |
| 8,628,016 B2 | 1/2014 | Winegar | |
| 8,629,926 B2 | 1/2014 | Wang | |
| 8,630,491 B2 | 1/2014 | Longacre et al. | |
| 8,635,309 B2 | 1/2014 | Berthiaume et al. | |
| 8,636,200 B2 | 1/2014 | Kearney | |
| 8,636,212 B2 | 1/2014 | Nahill et al. | |
| 8,636,215 B2 | 1/2014 | Ding et al. | |
| 8,636,224 B2 | 1/2014 | Wang | |
| 8,638,806 B2 | 1/2014 | Wang et al. | |
| 8,640,958 B2 | 2/2014 | Lu et al. | |
| 8,640,960 B2 | 2/2014 | Wang et al. | |
| 8,643,717 B2 | 2/2014 | Li et al. | |
| 8,646,692 B2 | 2/2014 | Meier et al. | |
| 8,646,694 B2 | 2/2014 | Wang et al. | |
| 8,657,200 B2 | 2/2014 | Ren et al. | |
| 8,659,397 B2 | 2/2014 | Vargo et al. | |
| 8,668,149 B2 | 3/2014 | Good | |
| 8,678,285 B2 | 3/2014 | Kearney | |
| 8,678,286 B2 | 3/2014 | Smith et al. | |
| 8,682,077 B1 | 3/2014 | Longacre | |
| D702,237 S | 4/2014 | Oberpriller et al. | |
| 8,687,282 B2 | 4/2014 | Feng et al. | |
| 8,692,927 B2 | 4/2014 | Pease et al. | |
| 8,695,880 B2 | 4/2014 | Bremer et al. | |
| 8,698,949 B2 | 4/2014 | Grunow et al. | |
| 8,702,000 B2 | 4/2014 | Barber et al. | |
| 8,717,494 B2 | 5/2014 | Gannon | |
| 8,720,783 B2 | 5/2014 | Biss et al. | |
| 8,723,804 B2 | 5/2014 | Fletcher et al. | |
| 8,723,904 B2 | 5/2014 | Marty et al. | |
| 8,727,223 B2 | 5/2014 | Wang | |
| 8,740,082 B2 | 6/2014 | Wilz | |

(56) References Cited

U.S. PATENT DOCUMENTS

| | | |
|---|---|---|
| 8,740,085 B2 | 6/2014 | Furlong et al. |
| 8,746,563 B2 | 6/2014 | Hennick et al. |
| 8,750,445 B2 | 6/2014 | Peake et al. |
| 8,752,766 B2 | 6/2014 | Xian et al. |
| 8,756,059 B2 | 6/2014 | Braho et al. |
| 8,757,495 B2 | 6/2014 | Qu et al. |
| 8,760,563 B2 | 6/2014 | Koziol et al. |
| 8,763,909 B2 | 7/2014 | Reed et al. |
| 8,777,108 B2 | 7/2014 | Coyle |
| 8,777,109 B2 | 7/2014 | Oberpriller et al. |
| 8,779,898 B2 | 7/2014 | Havens et al. |
| 8,781,520 B2 | 7/2014 | Payne et al. |
| 8,783,573 B2 | 7/2014 | Havens et al. |
| 8,789,757 B2 | 7/2014 | Barten |
| 8,789,758 B2 | 7/2014 | Hawley et al. |
| 8,789,759 B2 | 7/2014 | Xian et al. |
| 8,794,520 B2 | 8/2014 | Wang et al. |
| 8,794,522 B2 | 8/2014 | Ehrhart |
| 8,794,525 B2 | 8/2014 | Amundsen et al. |
| 8,794,526 B2 | 8/2014 | Wang et al. |
| 8,798,367 B2 | 8/2014 | Ellis |
| 8,807,431 B2 | 8/2014 | Wang et al. |
| 8,807,432 B2 | 8/2014 | Van Horn et al. |
| 8,820,630 B2 | 9/2014 | Qu et al. |
| 8,822,848 B2 | 9/2014 | Meagher |
| 8,824,692 B2 | 9/2014 | Sheerin et al. |
| 8,824,696 B2 | 9/2014 | Braho |
| 8,842,849 B2 | 9/2014 | Wahl et al. |
| 8,844,822 B2 | 9/2014 | Kotlarsky et al. |
| 8,844,823 B2 | 9/2014 | Fritz et al. |
| 8,849,019 B2 | 9/2014 | Li et al. |
| D716,285 S | 10/2014 | Chaney et al. |
| 8,851,383 B2 | 10/2014 | Yeakley et al. |
| 8,854,633 B2 | 10/2014 | Laffargue |
| 8,866,963 B2 | 10/2014 | Grunow et al. |
| 8,868,421 B2 | 10/2014 | Braho et al. |
| 8,868,519 B2 | 10/2014 | Maloy et al. |
| 8,868,802 B2 | 10/2014 | Barten |
| 8,868,803 B2 | 10/2014 | Caballero |
| 8,870,074 B1 | 10/2014 | Gannon |
| 8,879,639 B2 | 11/2014 | Sauerwein |
| 8,880,426 B2 | 11/2014 | Smith |
| 8,881,983 B2 | 11/2014 | Havens et al. |
| 8,881,987 B2 | 11/2014 | Wang |
| 8,903,172 B2 | 12/2014 | Smith |
| 8,908,995 B2 | 12/2014 | Benos et al. |
| 8,910,870 B2 | 12/2014 | Li et al. |
| 8,910,875 B2 | 12/2014 | Ren et al. |
| 8,914,290 B2 | 12/2014 | Hendrickson et al. |
| 8,914,788 B2 | 12/2014 | Pettinelli et al. |
| 8,915,439 B2 | 12/2014 | Feng et al. |
| 8,915,444 B2 | 12/2014 | Havens et al. |
| 8,916,789 B2 | 12/2014 | Woodburn |
| 8,918,250 B2 | 12/2014 | Hollifield |
| 8,918,564 B2 | 12/2014 | Caballero |
| 8,925,818 B2 | 1/2015 | Kosecki et al. |
| 8,939,374 B2 | 1/2015 | Jovanovski et al. |
| 8,942,480 B2 | 1/2015 | Ellis |
| 8,944,313 B2 | 2/2015 | Williams et al. |
| 8,944,327 B2 | 2/2015 | Meier et al. |
| 8,944,332 B2 | 2/2015 | Harding et al. |
| 8,950,678 B2 | 2/2015 | Germaine et al. |
| D723,560 S | 3/2015 | Zhou et al. |
| 8,967,468 B2 | 3/2015 | Gomez et al. |
| 8,971,346 B2 | 3/2015 | Sevier |
| 8,976,030 B2 | 3/2015 | Cunningham et al. |
| 8,976,368 B2 | 3/2015 | Akel et al. |
| 8,978,981 B2 | 3/2015 | Guan |
| 8,978,983 B2 | 3/2015 | Bremer et al. |
| 8,978,984 B2 | 3/2015 | Hennick et al. |
| 8,985,456 B2 | 3/2015 | Zhu et al. |
| 8,985,457 B2 | 3/2015 | Soule et al. |
| 8,985,459 B2 | 3/2015 | Kearney et al. |
| 8,985,461 B2 | 3/2015 | Gelay et al. |
| 8,988,578 B2 | 3/2015 | Showering |
| 8,988,590 B2 | 3/2015 | Gillet et al. |
| 8,991,704 B2 | 3/2015 | Hopper et al. |
| 8,996,194 B2 | 3/2015 | Davis et al. |
| 8,996,384 B2 | 3/2015 | Funyak et al. |
| 8,998,091 B2 | 4/2015 | Edmonds et al. |
| 9,002,641 B2 | 4/2015 | Showering |
| 9,007,368 B2 | 4/2015 | Laffargue et al. |
| 9,010,641 B2 | 4/2015 | Qu et al. |
| 9,015,513 B2 | 4/2015 | Murawski et al. |
| 9,016,576 B2 | 4/2015 | Brady et al. |
| D730,357 S | 5/2015 | Fitch et al. |
| 9,022,288 B2 | 5/2015 | Nahill et al. |
| 9,030,964 B2 | 5/2015 | Essinger et al. |
| 9,033,240 B2 | 5/2015 | Smith et al. |
| 9,033,242 B2 | 5/2015 | Gillet et al. |
| 9,036,054 B2 | 5/2015 | Koziol et al. |
| 9,037,344 B2 | 5/2015 | Chamberlin |
| 9,038,911 B2 | 5/2015 | Xian et al. |
| 9,038,915 B2 | 5/2015 | Smith |
| D730,901 S | 6/2015 | Oberpriller et al. |
| D730,902 S | 6/2015 | Fitch et al. |
| D733,112 S | 6/2015 | Chaney et al. |
| 9,047,098 B2 | 6/2015 | Barten |
| 9,047,359 B2 | 6/2015 | Caballero et al. |
| 9,047,420 B2 | 6/2015 | Caballero |
| 9,047,525 B2 | 6/2015 | Barber |
| 9,047,531 B2 | 6/2015 | Showering et al. |
| 9,049,640 B2 | 6/2015 | Wang et al. |
| 9,053,055 B2 | 6/2015 | Caballero |
| 9,053,378 B1 | 6/2015 | Hou et al. |
| 9,053,380 B2 | 6/2015 | Xian et al. |
| 9,057,641 B2 | 6/2015 | Amundsen et al. |
| 9,058,526 B2 | 6/2015 | Powilleit |
| 9,064,165 B2 | 6/2015 | Havens et al. |
| 9,064,167 B2 | 6/2015 | Xian et al. |
| 9,064,168 B2 | 6/2015 | Todeschini et al. |
| 9,064,254 B2 | 6/2015 | Todeschini et al. |
| 9,066,032 B2 | 6/2015 | Wang |
| 9,070,032 B2 | 6/2015 | Corcoran |
| D734,339 S | 7/2015 | Zhou et al. |
| D734,751 S | 7/2015 | Oberpriller et al. |
| 9,082,023 B2 | 7/2015 | Feng et al. |
| 9,224,022 B2 | 12/2015 | Ackley et al. |
| 9,224,027 B2 | 12/2015 | Van Horn et al. |
| D747,321 S | 1/2016 | London et al. |
| 9,230,140 B1 | 1/2016 | Ackley |
| 9,443,123 B2 | 1/2016 | Hejl |
| 9,250,712 B1 | 2/2016 | Todeschini |
| 9,258,033 B2 | 2/2016 | Showering |
| 9,262,633 B1 | 2/2016 | Todeschini et al. |
| 9,310,609 B2 | 4/2016 | Rueblinger et al. |
| D757,009 S | 5/2016 | Oberpriller et al. |
| 9,342,724 B2 | 5/2016 | McCloskey |
| 9,375,945 B1 | 6/2016 | Bowles |
| D760,719 S | 7/2016 | Zhou et al. |
| 9,390,596 B1 | 7/2016 | Todeschini |
| D762,604 S | 8/2016 | Fitch et al. |
| D762,647 S | 8/2016 | Fitch et al. |
| 9,412,242 B2 | 8/2016 | Van Horn et al. |
| D766,244 S | 9/2016 | Zhou et al. |
| 9,443,222 B2 | 9/2016 | Singel et al. |
| 9,478,113 B2 | 10/2016 | Xie et al. |
| 2001/0029196 A1* | 10/2001 | Wakamatsu ...... H04W 52/0264 455/574 |
| 2002/0075003 A1* | 6/2002 | Fridman ............ H02J 7/0047 324/426 |
| 2003/0050104 A1* | 3/2003 | Matsumura ....... H04W 52/0225 455/574 |
| 2006/0226228 A1 | 10/2006 | Gagne et al. |
| 2007/0063048 A1 | 3/2007 | Havens et al. |
| 2008/0061157 A1 | 3/2008 | Grosskopf et al. |
| 2008/0185432 A1 | 8/2008 | Caballero et al. |
| 2009/0134221 A1 | 5/2009 | Zhu et al. |
| 2010/0177076 A1 | 7/2010 | Essinger et al. |
| 2010/0177080 A1 | 7/2010 | Essinger et al. |
| 2010/0177707 A1 | 7/2010 | Essinger et al. |
| 2010/0177749 A1 | 7/2010 | Essinger et al. |
| 2010/0265880 A1 | 10/2010 | Rautiola et al. |
| 2011/0169999 A1 | 7/2011 | Grunow et al. |

(56) References Cited

U.S. PATENT DOCUMENTS

| | | |
|---|---|---|
| 2011/0202554 A1 | 8/2011 | Powilleit et al. |
| 2012/0111946 A1 | 5/2012 | Golant |
| 2012/0168511 A1 | 7/2012 | Kotlarsky et al. |
| 2012/0168512 A1 | 7/2012 | Kotlarsky et al. |
| 2012/0193423 A1 | 8/2012 | Samek |
| 2012/0203647 A1 | 8/2012 | Smith |
| 2012/0223141 A1 | 9/2012 | Good et al. |
| 2012/0224014 A1* | 9/2012 | Katsumata ............... B41J 2/36 347/194 |
| 2012/0228382 A1 | 9/2012 | Havens et al. |
| 2012/0248188 A1 | 10/2012 | Kearney |
| 2012/0284552 A1 | 11/2012 | Archer, Jr. et al. |
| 2013/0043312 A1 | 2/2013 | Van Horn |
| 2013/0075168 A1 | 3/2013 | Amundsen et al. |
| 2013/0082104 A1 | 4/2013 | Kearney et al. |
| 2013/0175341 A1 | 7/2013 | Kearney et al. |
| 2013/0175343 A1 | 7/2013 | Good |
| 2013/0257744 A1 | 10/2013 | Daghigh et al. |
| 2013/0257759 A1 | 10/2013 | Daghigh |
| 2013/0270346 A1 | 10/2013 | Xian et al. |
| 2013/0287258 A1 | 10/2013 | Kearney |
| 2013/0292475 A1 | 11/2013 | Kotlarsky et al. |
| 2013/0292477 A1 | 11/2013 | Hennick et al. |
| 2013/0293539 A1 | 11/2013 | Hunt et al. |
| 2013/0293540 A1 | 11/2013 | Laffargue et al. |
| 2013/0306728 A1 | 11/2013 | Thuries et al. |
| 2013/0306731 A1 | 11/2013 | Pedraro |
| 2013/0307964 A1 | 11/2013 | Bremer et al. |
| 2013/0308625 A1 | 11/2013 | Park et al. |
| 2013/0313324 A1 | 11/2013 | Koziol et al. |
| 2013/0313325 A1 | 11/2013 | Wilz et al. |
| 2013/0342717 A1 | 12/2013 | Havens et al. |
| 2014/0001267 A1 | 1/2014 | Giordano et al. |
| 2014/0002828 A1 | 1/2014 | Laffargue et al. |
| 2014/0008439 A1 | 1/2014 | Wang |
| 2014/0025584 A1 | 1/2014 | Liu et al. |
| 2014/0100813 A1 | 1/2014 | Showering |
| 2014/0034734 A1 | 2/2014 | Sauerwein |
| 2014/0036848 A1 | 2/2014 | Pease et al. |
| 2014/0039693 A1 | 2/2014 | Havens et al. |
| 2014/0042814 A1 | 2/2014 | Kather et al. |
| 2014/0049120 A1 | 2/2014 | Kohtz et al. |
| 2014/0049635 A1 | 2/2014 | Laffargue et al. |
| 2014/0061306 A1 | 3/2014 | Wu et al. |
| 2014/0063289 A1 | 3/2014 | Hussey et al. |
| 2014/0066136 A1 | 3/2014 | Sauerwein et al. |
| 2014/0067692 A1 | 3/2014 | Ye et al. |
| 2014/0070005 A1 | 3/2014 | Nahill et al. |
| 2014/0071840 A1 | 3/2014 | Venancio |
| 2014/0074746 A1 | 3/2014 | Wang |
| 2014/0075220 A1 | 3/2014 | Song |
| 2014/0076974 A1 | 3/2014 | Havens et al. |
| 2014/0078341 A1 | 3/2014 | Havens et al. |
| 2014/0078342 A1 | 3/2014 | Li et al. |
| 2014/0078345 A1 | 3/2014 | Showering |
| 2014/0097249 A1 | 4/2014 | Gomez et al. |
| 2014/0098792 A1 | 4/2014 | Wang et al. |
| 2014/0100774 A1 | 4/2014 | Showering |
| 2014/0103115 A1 | 4/2014 | Meier et al. |
| 2014/0104413 A1 | 4/2014 | McCloskey et al. |
| 2014/0104414 A1 | 4/2014 | McCloskey et al. |
| 2014/0104416 A1 | 4/2014 | Giordano et al. |
| 2014/0104451 A1 | 4/2014 | Todeschini et al. |
| 2014/0106594 A1 | 4/2014 | Skvoretz |
| 2014/0106725 A1 | 4/2014 | Sauerwein |
| 2014/0108010 A1 | 4/2014 | Maltseff et al. |
| 2014/0108402 A1 | 4/2014 | Gomez et al. |
| 2014/0108682 A1 | 4/2014 | Caballero |
| 2014/0110485 A1 | 4/2014 | Toa et al. |
| 2014/0114530 A1 | 4/2014 | Fitch et al. |
| 2014/0124577 A1 | 5/2014 | Wang et al. |
| 2014/0124579 A1 | 5/2014 | Ding |
| 2014/0125842 A1 | 5/2014 | Winegar |
| 2014/0125853 A1 | 5/2014 | Wang |
| 2014/0125999 A1 | 5/2014 | Longacre et al. |
| 2014/0129378 A1 | 5/2014 | Richardson |
| 2014/0131438 A1 | 5/2014 | Kearney |
| 2014/0131441 A1 | 5/2014 | Nahill et al. |
| 2014/0131443 A1 | 5/2014 | Smith |
| 2014/0131444 A1 | 5/2014 | Wang |
| 2014/0131445 A1 | 5/2014 | Ding et al. |
| 2014/0131448 A1 | 5/2014 | Xian et al. |
| 2014/0133379 A1 | 5/2014 | Wang et al. |
| 2014/0136208 A1 | 5/2014 | Maltseff et al. |
| 2014/0140585 A1 | 5/2014 | Wang |
| 2014/0151453 A1 | 6/2014 | Meier et al. |
| 2014/0152882 A1 | 6/2014 | Samek et al. |
| 2014/0158770 A1 | 6/2014 | Sevier et al. |
| 2014/0159869 A1 | 6/2014 | Zumsteg et al. |
| 2014/0166755 A1 | 6/2014 | Liu et al. |
| 2014/0166757 A1 | 6/2014 | Smith |
| 2014/0166759 A1 | 6/2014 | Liu et al. |
| 2014/0168787 A1 | 6/2014 | Wang et al. |
| 2014/0175165 A1 | 6/2014 | Havens et al. |
| 2014/0175172 A1 | 6/2014 | Jovanovski et al. |
| 2014/0191644 A1 | 7/2014 | Chaney |
| 2014/0191913 A1 | 7/2014 | Ge et al. |
| 2014/0197238 A1 | 7/2014 | Lui et al. |
| 2014/0197239 A1 | 7/2014 | Havens et al. |
| 2014/0197304 A1 | 7/2014 | Feng et al. |
| 2014/0203087 A1 | 7/2014 | Smith et al. |
| 2014/0204268 A1 | 7/2014 | Grunow et al. |
| 2014/0214631 A1 | 7/2014 | Hansen |
| 2014/0217166 A1 | 8/2014 | Berthiaume et al. |
| 2014/0217180 A1 | 8/2014 | Liu |
| 2014/0231500 A1 | 8/2014 | Ehrhart et al. |
| 2014/0232930 A1 | 8/2014 | Anderson |
| 2014/0247315 A1 | 9/2014 | Marty et al. |
| 2014/0263493 A1 | 9/2014 | Amurgis et al. |
| 2014/0263645 A1 | 9/2014 | Smith et al. |
| 2014/0267609 A1 | 9/2014 | Laffargue |
| 2014/0270196 A1 | 9/2014 | Braho et al. |
| 2014/0270229 A1 | 9/2014 | Braho |
| 2014/0278387 A1 | 9/2014 | DiGregorio |
| 2014/0278391 A1 | 9/2014 | Braho et al. |
| 2014/0282210 A1 | 9/2014 | Bianconi |
| 2014/0284384 A1 | 9/2014 | Lu et al. |
| 2014/0288933 A1 | 9/2014 | Braho et al. |
| 2014/0297058 A1 | 10/2014 | Barker et al. |
| 2014/0299665 A1 | 10/2014 | Barber et al. |
| 2014/0312121 A1 | 10/2014 | Lu et al. |
| 2014/0319220 A1 | 10/2014 | Coyle |
| 2014/0319221 A1 | 10/2014 | Oberpriller et al. |
| 2014/0326787 A1 | 11/2014 | Barten |
| 2014/0332590 A1 | 11/2014 | Wang et al. |
| 2014/0344943 A1 | 11/2014 | Todeschini et al. |
| 2014/0346233 A1 | 11/2014 | Liu et al. |
| 2014/0351317 A1 | 11/2014 | Smith et al. |
| 2014/0353373 A1 | 12/2014 | Van Horn et al. |
| 2014/0361073 A1 | 12/2014 | Qu et al. |
| 2014/0361082 A1 | 12/2014 | Xian et al. |
| 2014/0362184 A1 | 12/2014 | Jovanovski et al. |
| 2014/0363015 A1 | 12/2014 | Braho |
| 2014/0369511 A1 | 12/2014 | Sheerin et al. |
| 2014/0374483 A1 | 12/2014 | Lu |
| 2014/0374485 A1 | 12/2014 | Xian et al. |
| 2015/0001301 A1 | 1/2015 | Ouyang |
| 2015/0001304 A1 | 1/2015 | Todeschini |
| 2015/0003673 A1 | 1/2015 | Fletcher |
| 2015/0009338 A1 | 1/2015 | Laffargue et al. |
| 2015/0009610 A1 | 1/2015 | London et al. |
| 2015/0014416 A1 | 1/2015 | Kotlarsky et al. |
| 2015/0021397 A1 | 1/2015 | Rueblinger et al. |
| 2015/0028102 A1 | 1/2015 | Ren et al. |
| 2015/0028103 A1 | 1/2015 | Jiang |
| 2015/0028104 A1 | 1/2015 | Ma et al. |
| 2015/0029002 A1 | 1/2015 | Yeakley et al. |
| 2015/0032709 A1 | 1/2015 | Maloy et al. |
| 2015/0039309 A1 | 2/2015 | Braho et al. |
| 2015/0039878 A1 | 2/2015 | Barten |
| 2015/0040378 A1 | 2/2015 | Saber et al. |
| 2015/0048168 A1 | 2/2015 | Fritz et al. |
| 2015/0049347 A1 | 2/2015 | Laffargue et al. |
| 2015/0051992 A1 | 2/2015 | Smith |

(56) References Cited

U.S. PATENT DOCUMENTS

| | | |
|---|---|---|
| 2015/0053766 A1 | 2/2015 | Havens et al. |
| 2015/0053768 A1 | 2/2015 | Wang et al. |
| 2015/0053769 A1 | 2/2015 | Thuries et al. |
| 2015/0057830 A1 | 2/2015 | Slaby et al. |
| 2015/0060544 A1 | 3/2015 | Feng et al. |
| 2015/0062366 A1 | 3/2015 | Liu et al. |
| 2015/0063215 A1 | 3/2015 | Wang |
| 2015/0063676 A1 | 3/2015 | Lloyd et al. |
| 2015/0069130 A1 | 3/2015 | Gannon |
| 2015/0071819 A1 | 3/2015 | Todeschini |
| 2015/0083800 A1 | 3/2015 | Li et al. |
| 2015/0086114 A1 | 3/2015 | Todeschini |
| 2015/0088522 A1 | 3/2015 | Hendrickson et al. |
| 2015/0096872 A1 | 4/2015 | Woodburn |
| 2015/0099557 A1 | 4/2015 | Pettinelli et al. |
| 2015/0100196 A1 | 4/2015 | Hollifield |
| 2015/0102109 A1 | 4/2015 | Huck |
| 2015/0115035 A1 | 4/2015 | Meier et al. |
| 2015/0124390 A1 | 5/2015 | Koch |
| 2015/0127791 A1 | 5/2015 | Kosecki et al. |
| 2015/0128116 A1 | 5/2015 | Chen et al. |
| 2015/0129659 A1 | 5/2015 | Feng et al. |
| 2015/0133047 A1 | 5/2015 | Smith et al. |
| 2015/0134470 A1 | 5/2015 | Hejl et al. |
| 2015/0134988 A1 | 5/2015 | Wang et al. |
| 2015/0136851 A1 | 5/2015 | Harding et al. |
| 2015/0136854 A1 | 5/2015 | Lu et al. |
| 2015/0142492 A1 | 5/2015 | Kumar |
| 2015/0144692 A1 | 5/2015 | Hejl |
| 2015/0144698 A1 | 5/2015 | Teng et al. |
| 2015/0144701 A1 | 5/2015 | Xian et al. |
| 2015/0149946 A1 | 5/2015 | Benos et al. |
| 2015/0153810 A1 | 6/2015 | Sasidharan et al. |
| 2015/0161429 A1 | 6/2015 | Xian |
| 2015/0169925 A1 | 6/2015 | Chang et al. |
| 2015/0169929 A1 | 6/2015 | Williams et al. |
| 2015/0178523 A1 | 6/2015 | Gelay et al. |
| 2015/0178534 A1 | 6/2015 | Jovanovski et al. |
| 2015/0178535 A1 | 6/2015 | Bremer et al. |
| 2015/0178536 A1 | 6/2015 | Hennick et al. |
| 2015/0178537 A1 | 6/2015 | El Akel et al. |
| 2015/0181093 A1 | 6/2015 | Zhu et al. |
| 2015/0181109 A1 | 6/2015 | Gillet et al. |
| 2015/0186703 A1 | 7/2015 | Chen et al. |
| 2015/0193644 A1 | 7/2015 | Kearney et al. |
| 2015/0193645 A1 | 7/2015 | Colavito et al. |
| 2015/0199957 A1 | 7/2015 | Funyak et al. |
| 2015/0202982 A1* | 7/2015 | Saint-Marcoux ......... B60L 7/10 701/22 |
| 2015/0204671 A1 | 7/2015 | Showering |
| 2015/0210199 A1 | 7/2015 | Payne |
| 2015/0212565 A1 | 7/2015 | Murawski et al. |
| 2015/0213647 A1 | 7/2015 | Laffargue et al. |
| 2015/0220753 A1 | 8/2015 | Zhu et al. |
| 2015/0220901 A1 | 8/2015 | Gomez et al. |
| 2015/0227189 A1 | 8/2015 | Davis et al. |
| 2015/0236984 A1 | 8/2015 | Sevier |
| 2015/0239348 A1 | 8/2015 | Chamberlin |
| 2015/0242648 A1 | 8/2015 | Lemmey et al. |
| 2015/0242671 A1 | 8/2015 | Smith et al. |
| 2015/0242836 A1 | 8/2015 | Smith |
| 2015/0248572 A1 | 9/2015 | Soule, III et al. |
| 2015/0254485 A1 | 9/2015 | Feng et al. |
| 2015/0256695 A1 | 9/2015 | Showering et al. |
| 2015/0261643 A1 | 9/2015 | Caballero et al. |
| 2015/0264624 A1 | 9/2015 | Wang et al. |
| 2015/0268971 A1 | 9/2015 | Barten |
| 2015/0269402 A1 | 9/2015 | Barber et al. |
| 2015/0276470 A1 | 10/2015 | Amundsen et al. |
| 2015/0288689 A1 | 10/2015 | Todeschini et al. |
| 2015/0288896 A1 | 10/2015 | Wang |
| 2015/0310244 A1 | 10/2015 | Xian et al. |
| 2015/0310247 A1 | 10/2015 | Todeschini et al. |
| 2015/0312780 A1 | 10/2015 | Wang et al. |
| 2015/0324623 A1 | 11/2015 | Powilleit |
| 2015/0327012 A1 | 11/2015 | Bian et al. |
| 2015/0379838 A1 | 12/2015 | Xie et al. |
| 2016/0014251 A1 | 1/2016 | Hejl |
| 2016/0026839 A1 | 1/2016 | Qu et al. |
| 2016/0040982 A1 | 2/2016 | Li et al. |
| 2016/0042241 A1 | 2/2016 | Todeschini |
| 2016/0057230 A1 | 2/2016 | Todeschini et al. |
| 2016/0069753 A1 | 3/2016 | Phan et al. |
| 2016/0109219 A1 | 4/2016 | Ackley et al. |
| 2016/0109220 A1 | 4/2016 | Laffargue |
| 2016/0109224 A1 | 4/2016 | Thuries et al. |
| 2016/0112631 A1 | 4/2016 | Ackley et al. |
| 2016/0112643 A1 | 4/2016 | Laffargue et al. |
| 2016/0124516 A1 | 5/2016 | Schoon et al. |
| 2016/0125217 A1 | 5/2016 | Todeschini |
| 2016/0125342 A1 | 5/2016 | Miller et al. |
| 2016/0133253 A1 | 5/2016 | Braho et al. |
| 2016/0171720 A1 | 6/2016 | Todeschini |
| 2016/0178479 A1 | 6/2016 | Goldsmith |
| 2016/0180678 A1 | 6/2016 | Ackley et al. |
| 2016/0189087 A1 | 6/2016 | Morton et al. |
| 2016/0125873 A1 | 7/2016 | Braho et al. |
| 2016/0198527 A1 | 7/2016 | Park |
| 2016/0227912 A1 | 8/2016 | Oberpriller et al. |
| 2016/0232891 A1 | 8/2016 | Pecorari |
| 2016/0248125 A1* | 8/2016 | Huang ............. H01M 10/4207 |
| 2016/0292477 A1 | 10/2016 | Bidwell |
| 2016/0294779 A1 | 10/2016 | Yeakley et al. |
| 2016/0299551 A1 | 10/2016 | Wu et al. |
| 2016/0306769 A1 | 10/2016 | Kohtz et al. |
| 2016/0314276 A1 | 10/2016 | Sewell et al. |
| 2016/0314294 A1 | 10/2016 | Kubler et al. |

FOREIGN PATENT DOCUMENTS

| | | |
|---|---|---|
| WO | 2013163789 A1 | 11/2013 |
| WO | 2013173985 A1 | 11/2013 |
| WO | 2014/026609 A1 | 2/2014 |
| WO | 2014019130 A1 | 2/2014 |
| WO | 2014110495 A1 | 7/2014 |
| WO | 2015/078408 A1 | 6/2015 |

OTHER PUBLICATIONS

U.S. Appl. No. 14/715,916 for Evaluating Image Values filed May 19, 2015 (Ackley); 60 pages.

U.S. Appl. No. 29/525,068 for Tablet Computer With Removable Scanning Device filed Apr. 27, 2015 (Schulte et al.); 19 pages.

U.S. Appl. No. 29/468,118 for an Electronic Device Case, filed Sep. 26, 2013 (Oberpriller et al.); 14 pages.

U.S. Appl. No. 29/530,600 for Cyclone filed Jun. 18, 2015 (Vargo et al); 16 pages.

U.S. Appl. No. 14/707,123 for Application Independent DEX/UCS Interface filed May 8, 2015 (Pape); 47 pages.

U.S. Appl. No. 14/283,282 for Terminal Having Illumination and Focus Control filed May 21, 2014 (Liu et al.); 31 pages; now abandoned.

U.S. Appl. No. 14/705,407 for Method and System to Protect Software-Based Network-Connected Devices From Advanced Persistent Threat filed May 6, 2015 (Hussey et al.); 42 pages.

U.S. Appl. No. 14/704,050 for Intermediate Linear Positioning filed May 5, 2015 (Charpentier et al.); 60 pages.

U.S. Appl. No. 14/705,012 for Hands-Free Human Machine Interface Responsive to a Driver of a Vehicle filed May 6, 2015 (Fitch et al.); 44 pages.

U.S. Appl. No. 14/715,672 for Augumented Reality Enabled Hazard Display filed May 19, 2015 (Venkatesha et al.); 35 pages.

U.S. Appl. No. 14/735,717 for Indicia-Reading Systems Having an Interface With a User's Nervous System filed Jun. 10, 2015 (Todeschini); 39 pages.

U.S. Appl. No. 14/702,110 for System and Method for Regulating Barcode Data Injection Into a Running Application on a Smart Device filed May 1, 2015 (Todeschini et al.); 38 pages.

U.S. Appl. No. 14/747,197 for Optical Pattern Projector filed Jun. 23, 2015 (Thuries et al.); 33 pages.

(56) References Cited

OTHER PUBLICATIONS

U.S. Appl. No. 14/702,979 for Tracking Battery Conditions filed May 4, 2015 (Young et al.); 70 pages.
U.S. Appl. No. 29/529,441 for Indicia Reading Device filed Jun. 8, 2015 (Zhou et al.); 14 pages.
U.S. Appl. No. 14/747,490 for Dual-Projector Three-Dimensional Scanner filed Jun. 23, 2015 (Jovanovski et al.); 40 pages.
U.S. Appl. No. 14/740,320 for Tactile Switch for a Mobile Electronic Device filed Jun. 16, 2015 (Bamdringa); 38 pages.
U.S. Appl. No. 14/740,373 for Calibrating a Volume Dimensioner filed Jun. 16, 2015 (Ackley et al.); 63 pages.
United Kingdom Combined Search and Examination Report in related UK Application No. GB1709144.8 dated Nov. 23, 2017, pp. 1-7.
Texas Instruments, "FDC2112-Q1, FDC2114-Q1, FDC2212-Q1, FDC2214-Q1 Multi-Channel 12-Bit or 28-Bit Capacitance-to-Digital Converter (FDC) for Capacitive Sensing," Dated May 2016, downloaded from www.ti.com, 58 pages.
Texas Instruments, "bq27545-G1 Single-Cell Li-Ion Battery Fuel Gauge for Battery Pack Integration," Dated Dec. 2015, Downloaded from www.ti.com, 53 pages.
U.S. Department of Transportaion, Federal Aviation Adminstration, "Aircraft Ice Detectors and Related Technologies for Onground and Inflight Applications," Final Report, dated Apr. 1993.
U.S. Appl. No. 13/367,978, filed Feb. 7, 2012, (Feng et al.); now abandoned.
U.S. Appl. No. 14/277,337 for Multipurpose Optical Reader, filed May 14, 2014 (Jovanovski et al.); 59 pages; now abandoned.
U.S. Appl. No. 14/446,391 for Multifunction Point of Sale Apparatus With Optical Signature Capture filed Jul. 30, 2014 (Good et al.); 37 pages; now abandoned.
U.S. Appl. No. 29/516,892 for Table Computer filed Feb. 6, 2015 (Bidwell et al.); 13 pages.
U.S. Appl. No. 29/523,098 for Handle for a Tablet Computer filed Apr. 7, 2015 (Bidwell et al.); 17 pages.
U.S. Appl. No. 29/528,890 for Mobile Computer Housing filed Jun. 2, 2015 (Fitch et al.); 61 pages.
U.S. Appl. No. 29/526,918 for Charging Base filed May 14, 2015 (Fitch et al.); 10 pages.
Combined Search and Examination Report in related UK Application No. GB1709146.3 dated Nov. 23, 2017, pp. 1-5.
Combined Search and Examination Report in related UK Application No. GB1709145.5 dated Nov. 23, 2017, pp. 1-7.

\* cited by examiner

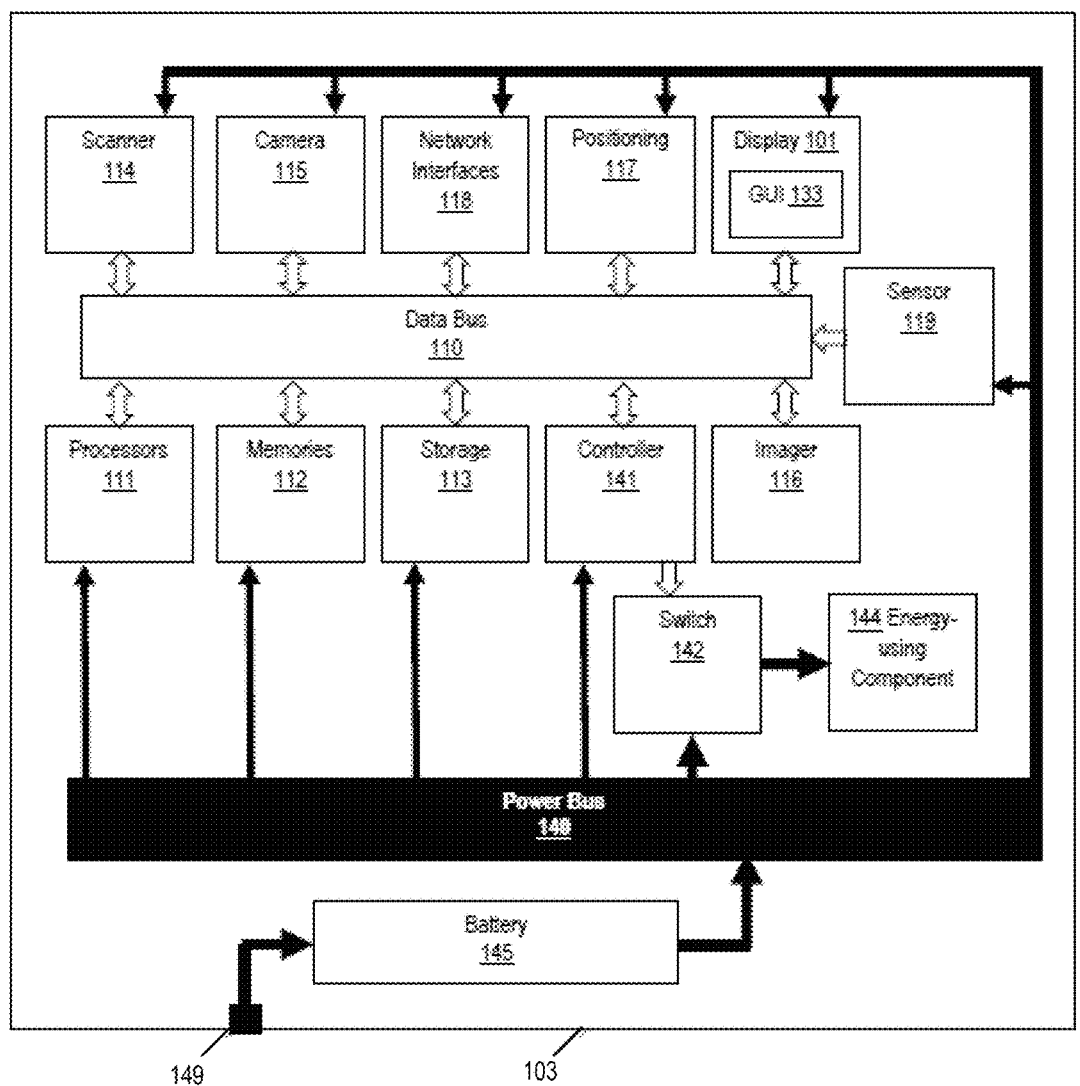
FIG. 4
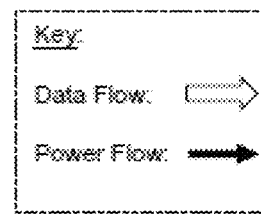

MANAGING ENERGY USAGE IN MOBILE DEVICES

TECHNOLOGY FIELD

The present invention relates generally to mobile devices. More particularly, example embodiments of the present invention relate to conserving energy in mobile devices and enhancing resistance to fogging or frosting of displays.

BACKGROUND

Generally speaking, mobile computing devices ("mobile devices") combine characteristics of high levels of mobility, usefulness, and affordability. With high general utility at low cost, the mobile devices have become commonplace even in the consumer electronics (CE) marketplace. At least as significant, moreover, is the adoption of the use of the mobile devices over a wide spectrum of industrial, technical, and commercial spaces. Examples include order picking, inventory, and parking law enforcement.

The high mobility characteristics also relate to the ability of mobile devices to operate untethered from external power sources. Mobile devices are energized, over significant portions of their operations, by electrical power consumed from an on-board battery source. As the mobile devices operate over time, the power remaining available from the batteries diminishes, and at some point, may be recharged.

Extending the duration of a battery charge, and corresponding time between recharges, may mitigate the reduction in the mobility characteristic associated with connecting the mobile devices to the chargers or swapping battery packs. Extending the duration of a battery charge allows the device to be used continuously or repeatedly over the period of the charge duration, and increases the mobility and efficiency of use.

The high mobility and communicability characteristics of mobile devices allow the use of the devices over significant distances, and in various environments. For example, a mobile device may be used within indoor environments, as well as outdoors. A first environment may have a first temperature, and a second environment may have a second temperature, higher than the first (or vice versa).

After use at a lower first temperature (e.g., outdoors on a cold day), the device may be moved, in use (or used subsequently), indoors into the warmer second temperature. Optical windows disposed over components of the device, such as display screens, scanners, and/or cameras, may fog over or frost over in such a circumstance obscuring the display or rendering a scanner or camera unusable. During the persistence of such fogging or frosting effects, the usefulness of the mobile device may be diminished. To prevent or ameliorate this effect, some mobile devices incorporate heater or other energy transfer elements to remove or prevent fog or frosting.

Like the other components of the mobile device, the heater elements are energized by the on-board battery. While they are energized, the heater elements may consume significant amounts of power from the battery at a high rate. Thus, the operation of the heater elements may reduce the duration of a battery charge ("runtime") and the amount of time until the next recharge. Increased peak power usage may also cause a premature shut down of the mobile device before the battery has been fully discharged.

It could be useful therefore, to promote the extension of the mobility characteristics of mobile devices in general, and more particularly, in relation to energy efficiency and operational features that may promote the range and spectrum of environments in which they may be used. It could also be useful to reduce the effect of mobile device heater element operation on the duration of a battery charge. It could be useful, further, to increase the efficiency of the operations of mobile device heater elements and other power consuming circuits in the mobile device that can be set to a lower power state or selectively disabled.

SUMMARY

Accordingly, in one aspect, example embodiments of the present invention relate to promoting the extension of the mobility characteristics of mobile devices in general, and more particularly, in relation to energy efficiency and operational features that may enhance the range and spectrum of environments in which they may be used. An example embodiment of the present invention relates to reducing the effect of mobile device heater element operation on the duration of a battery charge. An example embodiment of the present invention relates, further, to increasing the efficiency of the operations of mobile device heater elements and other power consuming circuits.

An example embodiment of the present invention relates to a method for managing energy usage by a mobile device. An environmental characteristic is monitored over at least two environments in which the mobile device is operable. A location of the mobile device is tracked in relation to the at least two environments. The mobile device is informed, based on the tracking. The mobile device is informed with data relating to the at least one environmental characteristic of the environment in which the mobile device is located.

In certain example embodiments, a characteristic of the mobile device may be sensed, as well. The data, related to the at least one environmental characteristic of the environment in which the mobile device is located, is compared to the sensed characteristic of the mobile device. An action is determined in relation to at least one energy-using operation of the mobile device based on the comparing of the environmental characteristic data to the sensed mobile device characteristic. The at least one energy-using operation of the mobile device is controlled, based on the determined action.

An example embodiment of the present invention relates to a mobile device, which is operable according to the energy management method, described herein.

Another example embodiment of the present invention relates to a non-transitory computer readable storage medium. The storage medium may be a component of the mobile device. The storage medium stores instructions, which upon execution by a processor, e.g., of the mobile device, are operable for causing, controlling, or programming the processor to perform the energy management method, described herein. Example embodiments of the present invention relates to various network platforms. An example embodiment of the present invention relates to an energy management system. The energy management system is operable, over at least one of the various network platforms, for controlling the mobile device in relation to an energy-using operation.

In one example embodiment, a method for managing energy usage by a mobile device, involves: monitoring at least one environmental characteristic of at least two environments in which the mobile device is operable; tracking a location of the mobile device in relation to the at least two environments; informing the mobile device, based on the tracking, with data relating to the at least one environmental characteristic of the environment in which the mobile device is located; sensing a characteristic of the mobile device; comparing the data, related to the at least one environmental characteristic of the environment in which the mobile device is located, to the sensed characteristic of the mobile device; determining an action related to at least one energy-using operation of the mobile device based on the comparing of the environmental characteristic data to the sensed mobile device characteristic; and controlling the at least one energy-using operation of the mobile device based on the determined action.

In certain example embodiments, the mobile device has at least one component, and the controlled operation involves changing an operating state of the at least one mobile device component. In certain example embodiments, the mobile device component is a heater element, and the controlled operation involves changing an operating state of the heater element between one or more of: an energized state and a deenergized state; a deenergized state and an energized state; or a partially energized state. In certain example embodiments, the monitored at least one environmental characteristic is one or more of: a temperature; a humidity level; a relative humidity; or a dew point. In certain example embodiments, sensing the characteristic of the mobile device includes measuring a temperature of the mobile device. In certain example embodiments, determining an action involves computing a dew point based on the sensed mobile device characteristic and the monitored at least one environmental characteristic. In certain example embodiments, the method further involves energizing the heater element upon the computed dew point at least meeting a programmed value. In certain example embodiments, the at least meeting the programmed value comprises one or more of meeting or exceeding the programmed value. In certain example embodiments, the method further includes de-energizing the heater element upon the programmed value exceeding the computed dew point. In certain example embodiments, the monitoring is performed continuously, repeatedly, or periodically; and the tracking of the location of the mobile device in relation to the at least two environments involves: determining a position of the mobile device within a first of the at least two environments; and detecting a change in the position of the mobile device from within the first, to the at least second of the two environments; and the method further involves: upon the detecting the change in the position of the mobile device from within the first, to the at least second of the two environments, repeating, in relation to the at least second of the two environments, the informing, the sensing, the comparing, the determining, and the controlling.

In another example embodiment a mobile device is operable for managing energy usage. The mobile device includes an energy-using component. A processor is operable for controlling an operation of the energy-using component by: monitoring at least one environmental characteristic of at least two environments in which the mobile device is operable; tracking a location of the mobile device in relation to the at least two environments; informing the mobile device, based on the tracking, with data relating to the at least one environmental characteristic of the environment in which the mobile device is located; sensing a characteristic of the mobile device; comparing the data, related to the at least one environmental characteristic of the environment in which the mobile device is located, to the sensed characteristic of the mobile device; determining an action related to at least one energy-using operation of the mobile device based on the comparing of the environmental characteristic data to the sensed mobile device characteristic; and controlling the at least one energy-using operation of the mobile device based on the determined action.

In certain example embodiments, the energy-using component comprises a heater element, and the controlled operation comprises changing an operating state of the heater element between one or more of: an energized state and a deenergized state; a deenergized state and an energized state; or a partially energized state. In certain example embodiments, the monitored at least one environmental characteristic is one or more of: a temperature; a humidity; a relative humidity; or a dew point. In certain example embodiments, a sensor is operable for measuring a temperature of the mobile device. In certain example embodiments, the determining of the action involves computing a dew point based on the sensed mobile device characteristic and the monitored at least one environmental characteristic. In certain example embodiments, the device further has at least one network interface operable for exchanging data signals with the processor, and with a network, the data signals relating to one or more of: the monitoring of at least one environmental characteristic of at least two environments in which the mobile device is operable; the tracking of the location of the mobile device in relation to the at least two environments; or the informing of the mobile device with the data relating to the at least one environmental characteristic of the environment in which the mobile device is located.

In certain example embodiments, the mobile device further has a case disposed about and encasing a plurality of components of the mobile device; and an optically transparent window disposed within the case; where the energy-using component is operable for deterring one or more of a fog condensation or a frost deposit upon the optically transparent window.

In another example embodiment, a system for managing a usage of energy has a network operable for communicating data signals. A first sensor is disposed in a first environment, the first environment having an associated first characteristic, the first sensor operable for sensing the first characteristic, and for communicating data signals relating thereto over the network. A second sensor is disposed in at least a second environment, the at least second environment having an associated second characteristic, which is independent in relation to the first characteristic, the second sensor operable for sensing the second characteristic, and for communicating data signals relating thereto over the network. At least one mobile device is operable in the first and the at least second environments, and for communicating data signals over the network in relation to the sensed first characteristic, and the sensed second characteristic, the mobile device includes: an energy-using component and a processor operable for controlling an operation of the energy-using component by: monitoring at least one environmental characteristic of at least two environments in which the mobile device is operable; tracking a location of the mobile device in relation to the at least two environments; informing the mobile device, based on the tracking, with data relating to the at least one environmental characteristic of the environment in which the mobile device is located; sensing a characteristic of the mobile device; comparing the data, related to the at least one environmental characteristic of the environment in which the mobile device is located, to the sensed characteristic of the mobile device; determining an action related to at least one energy-using operation of the mobile device based on the comparing of the environmental characteristic data to the sensed mobile device characteristic; and controlling the at least one energy-using operation of the mobile device based on the determined action.

In certain example embodiments, the energy-using component comprises a heater element, and the controlled operation comprises changing an operating state of the heater element between one or more of: an energized state and a deenergized state; a deenergized state and an energized state; or a partially energized state. In certain example embodiments, the changing of the operating state of the heater element is performed based on a dew point computation performed in relation to the comparing of the at least one environmental characteristic of the environment in which the mobile device is located, to the sensed characteristic of the mobile device.

In another example embodiment, a method of controlling fog or frost on a mobile device involves: providing a programmed processor, one or more sensors and an energy transfer element that when activated removes fog or frost within the mobile device; the processor reading the one or more sensors disposed in the mobile device to determine if there is a fog or frost condition; the processor, upon detecting a fog or frost condition, activating the energy transfer element to remove fog or frost; and the processor, upon detecting an absence of the fog or frost condition, deactivating the energy transfer element.

In certain example embodiments, the one or more sensors is a temperature sensor, and the processor determines that there is a fog or frost condition if the temperature rises by more than a threshold $\Delta T$ over a prescribed period of time. In certain example embodiments, the processor determines that a fog or frost condition has passed when the temperature sensor detects a temperature of a prescribed temperature T_Clear In certain example embodiments, the value of $\Delta T$ is adjustable. In certain example embodiments, the temperature sensor measures a temperature of a window covering a display or an imaging optics system. In certain example embodiments, the one or more sensors can include a sensor that directly examines a surface of the mobile device to detect the presence of fog or frost. In certain example embodiments, the sensor is an optical sensor, and the processor determines that fog or frost is present by analysis of an image captured by the optical sensor. In certain example embodiments, the sensor comprises an ultrasound sensor, and where the processor determines that fog or frost is present by analysis of ultrasound signals that change in the presence of fog or frost. In certain example embodiments, activating the energy transfer element comprises activating the heater element by less than 100%.

In another example embodiment, a mobile device has one or more sensors that are configured to detect the presence of fog or frost on a surface of the mobile device. A battery provides power to the mobile device. An energy transfer element which, when activated, removes fog or frost from the surface of the mobile device is provided. A programmed processor, within the mobile device, is programmed to: read one or more sensors disposed in the mobile device to determine if there is a fog or frost condition; upon detecting a fog or frost condition, activating the heater element to remove fog or frost; and upon detecting an absence of the fog or frost condition, deactivating the energy transfer element.

In certain example embodiments, the one or more sensors includes a temperature sensor, and the processor determines that there is a fog or frost condition if the temperature rises by more than a threshold $\Delta T$ over a prescribed period of time. In certain example embodiments, the processor determines that a fog or frost condition has passed when the temperature sensor detects a temperature of a prescribed temperature T_Clear. In certain example embodiments, the value of $\Delta T$ is user adjustable. In certain example embodiments, the temperature sensor measures a temperature of a window covering a display or an imaging optics system. In certain example embodiments, the one or more sensors can include a sensor that directly examines a surface of the mobile device to detect the presence of fog or frost. In certain example embodiments, the sensor can include an optical sensor, and where the processor determines that fog or frost is present by analysis of an image captured by the optical sensor. In certain example embodiments, the sensor can include an ultrasound sensor, and where the processor determines that fog or frost is present by analysis of ultrasound signals that change in the presence of fog or frost. In certain example embodiments, the energy transfer element comprises a heater element and where activating the energy transfer element includes activating the heater element by less than 100%. In certain example embodiments, activation of the energy transfer element is determined by a state of the battery. In certain example embodiments, the surface comprises at least one of a window covering a display of the mobile device, or a window covering an imager of the mobile device.

In another example embodiment, a method of managing power in a battery powered mobile device involves: determining a current state of the battery by measuring a parameter indicative of the current state of the battery; calculating a battery power factor as a function of the parameter; comparing the battery power factor to a threshold; when the battery power factor exceeds the threshold, identifying a system or process within the mobile device whose power consumption can be reduced; and reducing the power consumption by altering or disabling the system or process.

In certain example embodiments, the identifying is carried out on the basis of an assigned priority of a plurality of systems or processes and selecting a lowest priority system or process that can be converted to a lower power consumption state as the identified system or process. In certain example embodiments, the determining comprises measuring a battery temperature, battery terminal voltage, and battery current draw. In certain example embodiments, the battery power factor is calculated by: assigning a value to each of the current state of the battery temperature as T; assigning a value to the terminal voltage as V; assigning a value to the current draw as I; and computing the battery power factor as the sum of T, V and I. In certain example embodiments, the identified system or process comprises a heater element, and where the power consumption is reduced by either deactivating the heater element or causing the heater element to operate at less than 100% heat generation. In certain example embodiments, the method further involves repeating the determining, calculating, and comparing; identifying a further system or process within the mobile device whose power consumption can be reduced; and further reducing the power consumption by altering or disabling the further system or process.

In certain example embodiments, identifying a system and identifying a further system are carried out on the basis of an assigned priority of a plurality of systems or processes and selecting a lowest priority system or process that can be converted to a lower power consumption state as the identified system or process and further identified system or process. In certain example embodiments, the method further involves determining that the current battery factor is lower than a prior battery factor by a prescribed amount; and upon determining that the current battery factor is lower than the prior battery factor by the prescribed amount, selecting a system or process for restoration to a higher power consumption state; and restoring the system or process to a higher power consumption state. In certain example embodiments, the selecting is carried out on the basis of an assigned priority of a plurality of systems or processes and selecting a higher priority system or process that can be converted to a higher power consumption state as the selected system or process.

In another example embodiment, a battery powered mobile device has a battery and a battery monitoring circuit that measures one or more parameters indicative of a current state of the battery. A plurality of operational systems and processes form a part of the mobile device. A programmed processor is programmed to carry out a process that involves: determining a current state of the battery by receiving data representing the one or more parameters from the battery monitoring circuit indicative of the current state of the battery; calculating a battery power factor as a function of the parameter; comparing the battery power factor to a threshold; when the battery power factor exceeds the threshold, identifying a system or process within the mobile device whose power consumption can be reduced; and reducing the power consumption by altering or disabling the identified system or process.

In certain example embodiments, the identifying is carried out by the processor on the basis of an assigned priority of the plurality of systems or processes and selecting a lowest priority system or process that can be converted to a lower power consumption state as the identified system or process. In certain example embodiments, the determining is carried out by the processor on the basis of a battery temperature, battery terminal voltage, and battery current draw as measured by the battery monitor circuit. In certain example embodiments, the processor calculates the battery power factor by: assigning a value to each of the current state of the battery temperature as T; assigning a value to the terminal voltage as V; assigning a value to the current draw as I; and computing the battery power factor as the sum of T, V and I. In certain example embodiments, the identified system or process is a heater element, and where the processor reduces the power consumption by either deactivating the heater element or causing the heater element to operate at less than 100% heat generation.

In certain example embodiments, the processor is further programmed to: repeat the determining, calculating, and comparing; identify a further system or process within the mobile device whose power consumption can be reduced; and further reduce the power consumption by altering or disabling the further system or process. In certain example embodiments, identifying a system or process and identifying a further system or process are carried out by the processor on the basis of an assigned priority of a plurality of systems or processes and selecting a lowest priority system or process that can be converted to a lower power consumption state as the identified system or process and further identified system or process.

In certain example embodiments, the processor is further programmed to: determine that the current battery factor is lower than a prior battery factor by a prescribed amount; and upon determining that the current battery factor is lower than the prior battery factor by the prescribed amount, select a system or process for restoration to a higher power consumption state; and restore the selected system or process to a higher power consumption state. In certain example embodiments, the selecting is carried out on the basis of an assigned priority of a plurality of systems or processes and selecting a higher priority system or process that can be converted to a higher power consumption state as the selected system or process.

In a further example embodiment, a battery powered mobile device has a battery and a battery monitoring circuit that measures battery temperature, battery terminal voltage and battery current draw as an indication of a current state of the battery. A plurality of operational systems and processes form a part of the mobile device. A stored priority table tabulates an assigned priority of the plurality of systems or processes that can be converted to a lower power consumption state as the identified system or process. A programmed processor is programmed to carry out a process comprising: determining a current state of the battery by receiving data representing the battery temperature, battery terminal voltage and battery current draw; calculating a battery power factor by assigning a value to the current state of the battery temperature as T, assigning a value to the terminal voltage as V, assigning a value to the current draw as I, and computing the battery power factor as the sum of T, V and I; comparing the battery power factor to a threshold; when the battery power factor exceeds the threshold, identifying a system or process within the mobile device whose power consumption can be reduced by reference to the priority table and selecting the lowest priority system or process that can be converted to a lower power consumption state; and reducing the power consumption by altering or disabling the identified system or process.

In certain example embodiments, the processor is further programmed to: determine that the current battery factor is lower than a prior battery factor by a prescribed amount; and upon determining that the current battery factor is lower than the prior battery factor by the prescribed amount, select a system or process that is operating in a lower power state or disabled for restoration to a higher power consumption state; where the selecting is carried out by referring to the priority table and selecting a highest priority system or process that can be converted to a higher power consumption state as the selected system or process; and restore the selected highest priority system or process to the higher power consumption state.

The foregoing summary is presented by way of example and illustration, and is not to be construed as limiting or restrictive in any sense. The foregoing summary presents a conceptual prelude in relation to some example features, functions, aspects and/or elements of embodiments of the present invention, and the manner in which the same may be implemented or accomplished, which are further explained within the following more detailed description of example embodiments and each figure ("FIG.") of the accompanying drawings referred to therein.

BRIEF DESCRIPTION OF THE DRAWINGS

FIG. 4 depicts example components of the mobile device, according to certain embodiments consistent with examples of the present invention;

DESCRIPTION OF EXAMPLE EMBODIMENTS

Figure 1A:
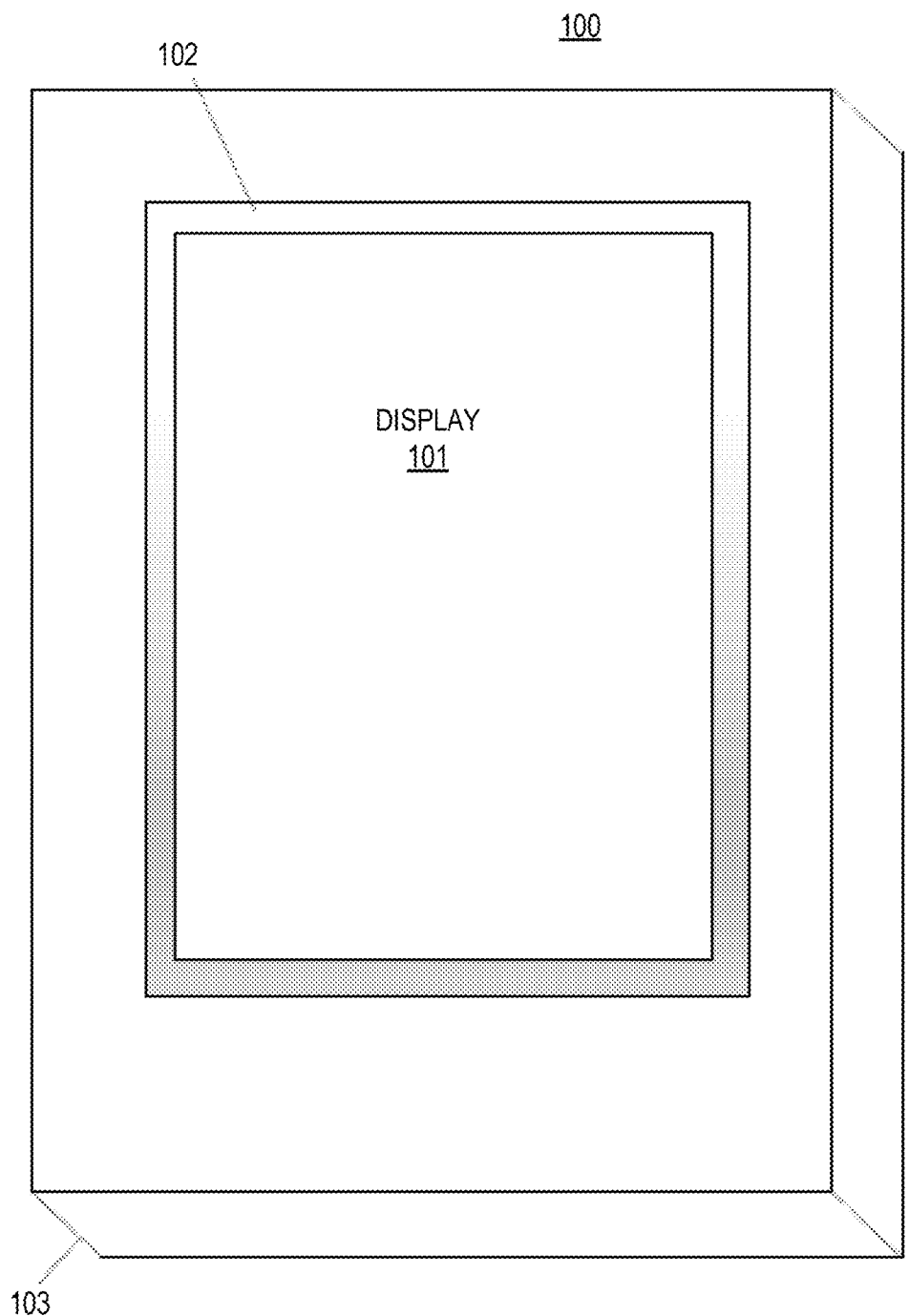
FIG. 1A depicts a first example view of a mobile device, according to an embodiment consistent with certain examples of the present invention.

Example embodiments of the present invention are described in relation to methods, mobile devices, and systems for managing energy usage by a mobile device.

In certain example embodiments, an environmental characteristic is monitored over environments in which the mobile device is operable. A location of the mobile device is tracked in relation to the environments. The mobile device is informed with data relating to the environmental characteristic of the environment in which the mobile device location is tracked. A characteristic of the mobile device is sensed. The data, related to the environmental characteristic of the tracked location, is compared to the sensed mobile device characteristic. An action is determined related to the energy-using operation of the mobile device based on the comparison. The energy-using operation of the mobile device is controlled, based on the determined action. Example embodiments of the present invention are also described in relation to non-transitory computer-readable storage media, and various network platforms.

When hand held computers, such as mobile devices, travel from a cool environment to a warm environment the display screen/scanner windows may fog and/or frost over. Energy transfer elements such as heater elements within a mobile device may be turned on whenever the mobile device goes into a cold environment to prevent the windows from fogging or frosting over, but this uses battery power somewhat indiscriminately, and reduce operational run times. Example embodiments of the present invention turn on the heater elements controllably, under conditions where a local dew point may be approached. Certain example embodiments use battery power controllably and under most conditions, may extend battery charges and time between charges, and associated operational run times, while deterring the fogging and/or frosting of the windows.

In certain example embodiments, environment sensors are placed that broadcast the current temperature and humidity levels of a location in which the mobile device is tracked.

In certain example embodiments, environmental data can be downloaded that constitute a local weather report.

In certain example embodiments, the information is transmitted directly to the handheld device via a low power RF signal, such as like Bluetooth Low Energy (BTLE), or via an Internet of Things (IOT).

In certain example embodiments consistent with the present invention, the sensor information is obtained by the mobile device using a network associated with a heating, ventilating, and air conditioning (HVAC) infrastructure. The information is sent via the HVAC network infrastructure (e.g., over a network associated therewith) to the mobile device or other handheld computer based on its location at the time.

Information can be obtained by the ERP (Enterprise Resource Planning) system which is instructing the user to move from one environment to the other.

The information is processed by the mobile device and used to compute the dew point temperature. The mobile device compares the dew point temperature to the case temperature and determines, accordingly, whether energizing the heater may be appropriate. Thus, example embodiments of the present invention are operable for deterring the accumulation of fog and/or frost on windows of the mobile device, while efficiently managing power usage and extending operational run time.

An example embodiment of the present invention relates to a method for managing energy usage by a mobile device. An environmental characteristic is monitored over at least two environments in which the mobile device is operable. A location of the mobile device is tracked in relation to the at least two environments. The mobile device is informed, based on the tracking. The mobile device is informed with data relating to the at least one environmental characteristic of the environment in which the mobile device is located. A characteristic of the mobile device is sensed. The data, related to the at least one environmental characteristic of the environment in which the mobile device is located, is compared to the sensed characteristic of the mobile device. An action is determined in relation to at least one energy-using operation of the mobile device based on the comparing of the environmental characteristic data to the sensed mobile device characteristic. The at least one energy-using operation of the mobile device is controlled, based on the determined action.

The controlled operation relates to changing an operating state of at least one component of the mobile device. The mobile device component may incorporate a heater element. The controlled operation relates to changing an operating state of the heater element between an energized state and a deenergized state, or vice versa.

The monitored environmental characteristic may be, for example, an ambient temperature, a measured humidity level, a computed relative humidity value, and/or a local dew point computed in relation to one or more of the ambient temperature, measured humidity level, or the computed relative humidity value.

The sensing of the characteristic of the mobile device may measure a temperature of the mobile device. The determining of the action may involve computing a dew point based on the sensed mobile device characteristic and the monitored environmental characteristic. The heater element may be energized upon the computed dew point at least meeting and/or exceeding a programmed value. The heater element may be deenergized upon the programmed value exceeding the computed dew point.

The monitoring of the environmental characteristic may be performed continuously, repeatedly, or periodically. The tracking of the location of the mobile device in relation to the at least two environments may involve determining a position of the mobile device within a first of the at least two environments, and detecting a change in the position of the mobile device from within the first, to the at least second of the two environments. The method may further include, upon the detecting the change in the position of the mobile device from within the first, to the at least second of the two environments, repeating, in relation to the at least second of the two environments, the informing, the sensing, the comparing, the determining, and the controlling.

Another example embodiment consistent with the present invention relates to a mobile device operable for managing energy usage. The mobile device has an energy-using component. An operation of the energy-using component is controlled by a processor. A non-transitory computer-readable storage medium stores instructions readable by the processor. The instructions are operable for causing, controlling, or programming the processor to perform a method related to the managing of the energy usage, the method may relate to any of the methods described herein.

The energy-using component of the mobile device may be a heater element. The controlled operation relates to changing an operating state of the heater element from an energized state to a deenergized state, or vice versa, from a deenergized state to an energized state. The changing of the operating state of the heater element may be based (at least partially) on the comparison of the monitored environmental characteristic to the sensed characteristic of the mobile device.

The monitored at least one environmental characteristic may be an ambient temperature, a measured humidity level, a computed relative humidity value and/or a local dew point computed in relation to one or more of the ambient temperature, measured humidity level, or the computed relative humidity value.

The mobile device may further include a sensor operable for measuring a temperature or other environmental condition of the mobile device. The sensed characteristic may be a temperature of the mobile device in one embodiment. For example, the sensed mobile device characteristic may be the temperature of the surface of the mobile device case, or the internal space of the mobile device within the case, in which electronic components of the mobile device are disposed. The determining of the action may involve computing a dew point based on the sensed mobile device characteristic and the monitored at least one environmental characteristic.

The mobile device further includes at least one network interface operable for exchanging data signals with the processor, and with a network. The data signals relate to the monitoring of at least one environmental characteristic of at least two environments in which the mobile device is operable, the tracking of the location of the mobile device in relation to the at least two environments, and/or the informing of the mobile device with the data relating to the at least one environmental characteristic of the environment in which the mobile device is located.

The case of the mobile device is disposed about a plurality of, components (e.g., electronic components), which are encased therein, e.g., protectively from environmental conditions and elements in the location in which the mobile device is disposed and/or operated. The mobile device may also include one or more optically transparent window disposed within the case. The energy-using component of certain embodiments is operable for deterring one or more of a fog condensation or a frost deposit upon the optically transparent window. Optics disposed within the case and beneath the windows may thus be maintained clear of fog and/or frost during operations of the mobile device. The mobile device may also include an image sensor such as a video graphics array (VGA), as well as a camera and/or a scanner. The operations of the heater promote undeterred operations of the image sensor, the camera, or the scanner, by deterring the accumulation of fog and/or frost on an outer surface of the windows.

An example embodiment of the present invention relates to a system, operable over a network platform, for managing energy usage by a mobile device. Example embodiments of the present invention relate to various network platforms, over which a system is operable for managing a usage of energy by a mobile device. The example system may include a network operable for communicating data signals. Example embodiments may be implemented in which the network is implemented as a Bluetooth™ or Bluetooth Low Energy™ (BTLE) related network, a network related to a HVAC system, and/or an Internet-of-Things (IOT) related internetwork.

A first sensor is disposed in a first environment. The first environment has an associated first characteristic, such as an ambient temperature. The first sensor is operable for sensing the first characteristic, and for communicating data signals relating thereto over the network. A second sensor is disposed in at least a second environment. The at least second environment has an associated second characteristic, such as an ambient temperature. The second sensor is operable for sensing the second characteristic, and for communicating data signals relating thereto over the network.

The characteristic of the at least second environment is independent in relation to the characteristic of the at least second environment. Thus, the ambient temperature characteristic of the second environment may equal or exceed the ambient temperature of the first environment. The ambient temperature characteristic of the first environment may, alternatively, exceed the ambient temperature of the first environment.

At least one mobile device is operable in the first environment, as well as in the at least second environment, for communicating data signals over the network in relation to the sensed first characteristic, and the sensed second characteristic. The mobile device has an energy-using component, such as a heater. The heater component is operable under a control of a processor. The processor is operable for controlling an operation of the energy-using component.

In certain embodiments, the mobile device has at least one non-transitory computer-readable storage medium, such as memory, and/or storage components. The non-transitory computer-readable storage media stores instructions readable by the processor and operable for causing, controlling, or programming the processor to perform any of the methods related to the managing of the energy usage as described herein.

FIG. 1A depicts a first example view 'A' of a mobile device 100, according to an embodiment of the present invention. The mobile device 100 may include a portable data terminal (PDT), a hand held computer such as a "smart phone" or other cellular radiotelephone configuration, a tablet style computer, a personal digital assistant (PDA), a portable terminal, etc. The mobile device 100 may include other portable computers, such as laptop style computers, or computers configured as another readily portable configuration.

The mobile device 100 is housed in a case 103, which encloses and encases a plurality of electronic components disposed within the case 103. The mobile device 100 has a display 101, such as a liquid crystal display (LCD) device, operable for rendering visible information over a surface of a viewing screen of the LCD. The surface of the viewing screen of the LCD 101 may be covered by an optically transparent window 102, which is disposed within the case 103. The LCD 101 may also operate as a touchpad.

Figure 1B:
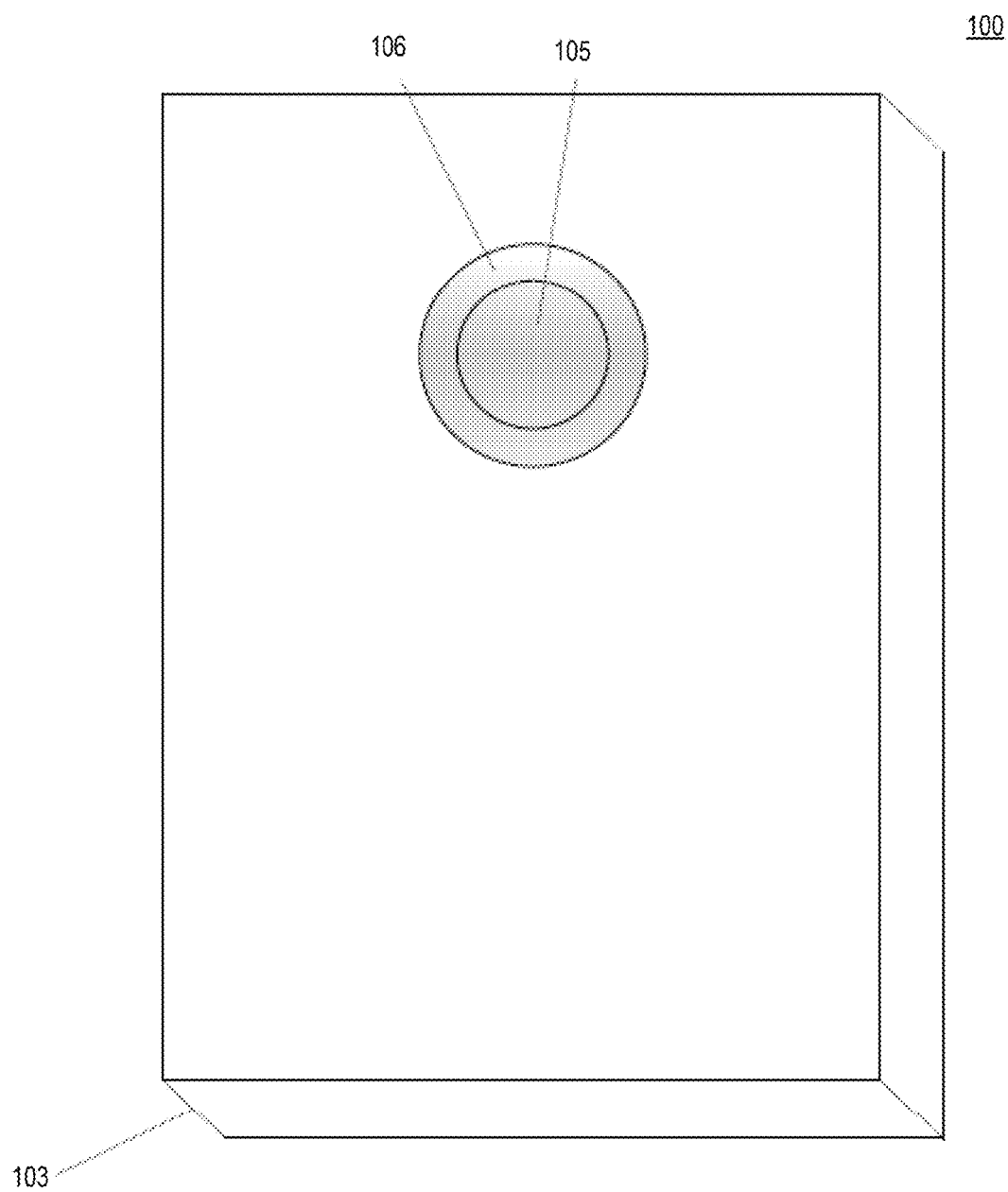
FIG. 1B depicts a second example view of the mobile device, according to an embodiment consistent with certain examples of the present invention.

The first view of FIG. 1A may correspond to a presentation of a "front" of the mobile device 100. FIG. 1B depicts a second example view 'B' of the mobile device 100, according to an embodiment of the present invention. The second view of FIG. 1B may correspond to a presentation of a "rear" of the mobile device 100, which is disposed opposite to the front. The mobile device 100 may have an array of passive optics 105, such as a lens or optical stack of lenses.

The passive optics array 105 functions to gather light in relation to operations of the mobile device 100. Such functions may include scanning of graphic media targets, photography, and/or videography, which are associated with capturing visual information from the gathered light. The surface of the passive optics 105 is covered by an optically transparent window 106, which is disposed within the case 103.

Figure 2:
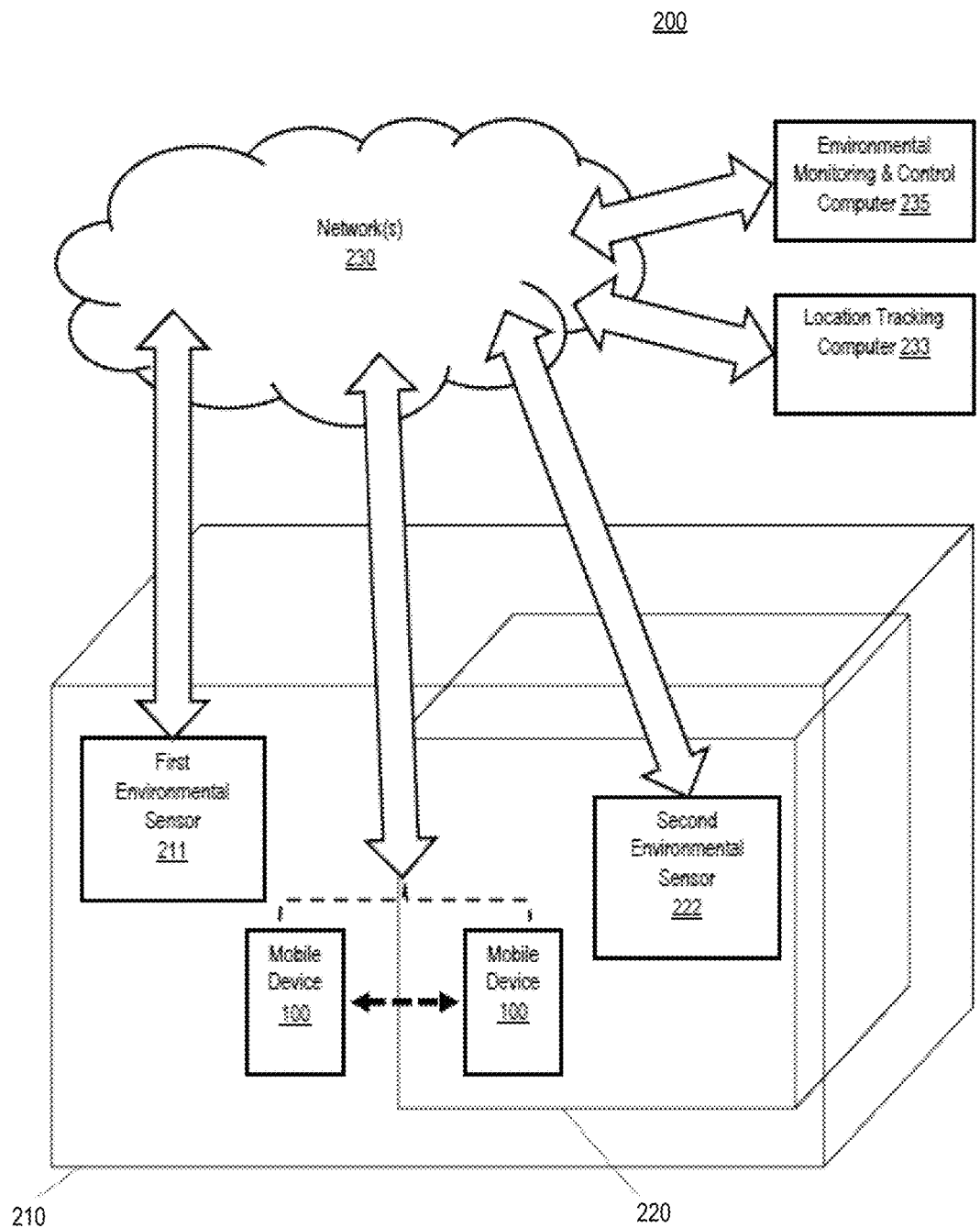
FIG. 2 depicts an example arrangement of various environments in which the mobile device may be operated, according to certain embodiments consistent with examples of the present invention.

FIG. 2 depicts an example operational platform 200, according to an embodiment of the present invention. The mobile device 100 is operable over locations disposed throughout a plurality of environments, which have at least a first environment and at least a second environment. The first environment in this example is shown disposed within a spatial envelope 210. The at least second environment is disposed within a second spatial envelope 220. For example, the second environment disposed within the corresponding envelope 220 may include an indoor operational environment of the mobile device 100. The first environment disposed within the corresponding envelope 210, and outside of the envelope 220 may include an outdoor operational milieu of the mobile device 100.

For purposes of example and illustration, the second environment and corresponding spatial envelope 220 is shown in FIG. 2 as disposed within the first environment and corresponding spatial envelope 210. It should be understood, however, that this depicted example illustration is not meant to be limiting or restrictive in any way. On the contrary, it should be understood that example embodiments may relate to the second environment disposed within, overlapping partially with, or be disposed outside of the first environment.

The location of the mobile device 100 may be tracked, e.g., using operations related to a geopositioning mechanism. The tracking of the location of the mobile device 100 involves determining a position thereof in relation to the first environment, and/or the second environment. Any suitable mechanism including, but not limited to, GPS positioning and other location positioning using WiFi, Bluetooth, NFC or other signal strength metrics and triangulation can be used to establish the location of mobile device 100 with respect to the two or more environments.

The example mobile device 100 is operable for exchanging data signals over one or more networks 230. A location tracking computer 233 is operable for exchanging data signals over the network(s) ("network") 230. The tracking of the location of the mobile device 100 may involve exchanging signals with the location tracking computer 233 over the network 230.

A sensor 211 is disposed within the first environment. The sensor 211 is operable for sensing a characteristic, such as an ambient temperature of the first environment, and for exchanging corresponding data signals over the network 230 with an environmental monitoring and/or control computer 235. A sensor 212 is disposed within the second environment. The sensor 212 is operable for sensing a characteristic of the second environment, and for exchanging corresponding data signals over the network 230 with the environmental monitoring/control computer 235.

In one embodiment the local server 235 may download the local weather report from the Internet or other source of local weather in order to obtain environmental information related to one of the environments (e.g., if one environment is outdoors). This weather will include data for the current dew point, or will include data from which a current dew point can be determined. This dew point number can be used sent to the mobile device 100 network 230. The device temperature as measured by the device can then be used to determine if the dew point has been crossed and this data used to turn on the heater.

As the mobile device 100 operates within the first environment, its location therein is tracked and it is informed with data related to operations of the sensor 211. Location changes corresponding to movement of the mobile device 100 are tracked, including movement between a first position within the first environment, and a subsequent position within the second environment (and/or vice versa). As the mobile device 100 operates within the second environment, its location therein is tracked and it is informed with data related to operations of the sensor 212. Example embodiments may be implemented in which the informing of the mobile device 100 in relation to the sensors is provided with data signals communicated over the network 230 from the monitoring/control computer 235, or from the sensors themselves.

For example, the network 230 may be operable for exchanging signals with the sensors over a radio frequency (RF) channel. The channel may be, for example, a Bluetooth channel, operable within an 'Instrumentation, Scientific and Medical' (ISM) band of the RF spectrum from approximately 2.4 Gigahertz (GHz) to approx. 2.485 GHz, inclusive. The Bluetooth channel may be operable using Bluetooth Low Energy (BTLE), which may also be referred to as "Bluetooth Smart."

The network 230 may also include a portion of an 'Internet of Things' (IOT) related internetwork. The example mobile device 100 may be operable for exchanging the environmentally related data signals with each of the sensor 211 and the sensor 222 "directly" (e.g., independent of the monitoring/control computer 235) over the network 230, via the BTLE channel and/or the IOT "net."

The mobile device 100 is operable for sensing a characteristic, such as its own temperature on or within the case 103. The mobile device 100 performs operations such as energizing or de-energizing a heater 144 disposed within or about the case 103. The energy-using operation may be performed upon computing that its sensed condition, relative to the environmental characteristics of its location, may result in reduced optical clarity and/or transparency of the window 102 and/or the window 106.

For example, the ambient temperature of the first environment (e.g., outdoors) may be significantly lower than the ambient temperature of the second environment (e.g., indoors). As the mobile device 100 is used in the first environment, its own temperature assumes, or at least approaches the relatively cool ambient temperature of the first environment. The location of the mobile device 100 is tracked as it moves from the first environment indoors, into the relatively warmer second environment.

The mobile device 100 is informed as to the warmer temperature of the second environment, yet the cooler temperature sensed in relation to its case (or the space enclosed therewith) may persist for a duration of time before it warms up to the ambient temperature of the second environment. During this time, a dew point associated with the temperature of the case 103, relative to the warmer ambient temperature of the second environment, may be reached or exceeded.

The mobile device 100 may thus energize the heater, which heats the window 102 and/or the window 106. The heating of the windows 102 and 106 deters formation of fog or frost accumulation on the surface of windows to promote continued clear transparency thereof. Moreover, the heaters are maintained in a deenergized state until the local dew point is reached or exceeded. The energized heaters may also be deenergized, upon the local characteristics changing to conditions below those corresponding to reaching the dew point.

Embodiments of the present invention thus function to manage the energy usage of the mobile device 100, in which the consumption of battery power by the heaters is minimized, the duration of a given battery charge is extended, along with the corresponding time until a recharge becomes appropriate. Example embodiments of the present invention thus relate to a method for managing energy usage by a mobile device.

Figure 3:
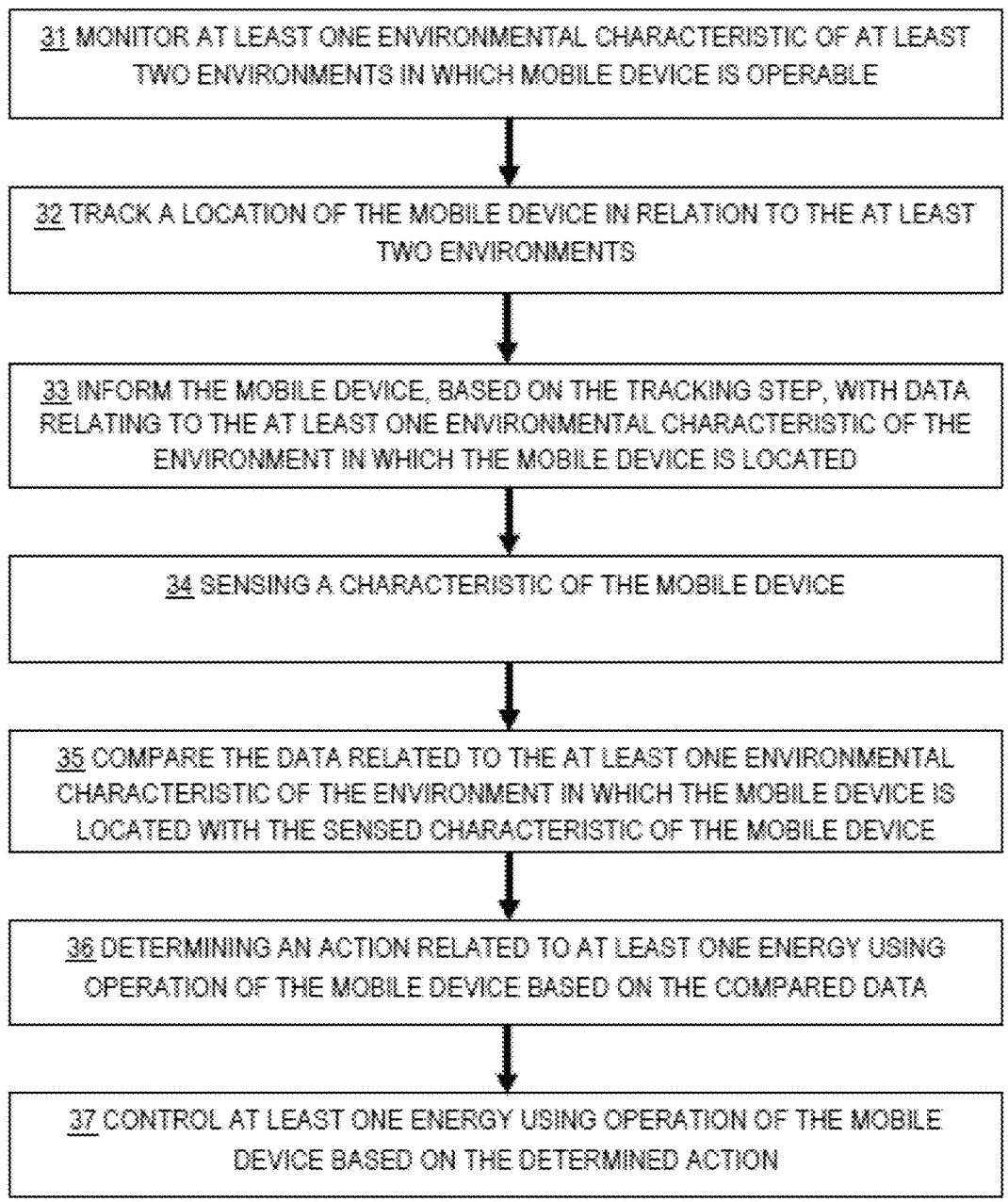
FIG. 3 depicts a flowchart for an example control process for managing energy usage by the mobile device, according to certain embodiments consistent with examples of the present invention.

An example embodiment of the present invention further relates to a method for managing energy usage by a mobile device. FIG. 3 depicts a flowchart for an example process 30 for displaying an image, according to an embodiment of the present invention.

At 31, an environmental characteristic is monitored over at least two environments in which the mobile device is operable.

At 32, a location of the mobile device is tracked in relation to the at least two environments.

At 33, the mobile device is informed, based on the tracking. The mobile device is informed with data relating to the at least one environmental characteristic of the environment in which the mobile device is located.

At 34, a characteristic of the mobile device is sensed.

The data, related to the at least one environmental characteristic of the environment in which the mobile device is located, are compared, at 35, to the sensed characteristic of the mobile device.

At 36, an action is determined in relation to at least one energy-using operation of the mobile device based on the comparing of the environmental characteristic data to the sensed mobile device characteristic.

At 37, the at least one energy-using operation of the mobile device is controlled, based on the determined action.

The controlled operation 37 relates to changing an operating state of at least one component of the mobile device. The example mobile device component may include a heater element 144. The controlled operation relates to changing an operating state of the heater element between an energized state and a deenergized state, or vice versa, or alternatively a variable level of heating somewhere between energized and deenergized.

The monitored environmental characteristic 31 may be an ambient temperature, a measured humidity level, a computed relative humidity value, and/or a local dew point computed in relation to one or more of the ambient temperature, measured humidity level, or the computed relative humidity value.

The sensing 34 of the characteristic of the mobile device may include measuring a temperature of the mobile device. The determining of the action 36 may include computing a dew point based on the sensed mobile device characteristic and the monitored environmental characteristic. The heater element may be energized upon the computed dew point at least meeting and/or exceeding a programmed value. The heater element may be deenergized upon the programmed value exceeding the computed dew point.

The monitoring 31 of the environmental characteristic may be performed continuously, repeatedly, or periodically. The tracking 32 of the location of the mobile device in relation to the at least two environments may include determining a position of the mobile device within a first of the at least two environments, and detecting a change in the position of the mobile device from within the first, to the at least second of the two environments. The method 30 further involves, upon the detecting the change in the position of the mobile device from within the first, to the at least second of the two environments, repeating, in relation to the at least second of the two environments, the informing 33, the sensing 34, the comparing 35, the determining 36, and the controlling 37.

The energy management method 30 may include a process performed in relation to operations associated with a mobile device. Example embodiments may thus relate to mobile devices operable for managing energy usage.

An example embodiment of the present invention relates to the mobile device 100. FIG. 4 depicts example components of the mobile device 100, according to an embodiment consistent with the present invention.

The mobile device 100 is operable for managing energy usage. The mobile device 100 includes an energy-using component, such as a heater element 144 or other element that deters or removes fog or frost. An operation of the energy-using component 144 is controlled by one or more processors 111. A non-transitory computer-readable storage medium stores instructions readable by the processor(s) 111.

The non-transitory computer-readable storage medium may be realized as one or more memories 112 and/or storage components 113. The memories ("memory") 112 may include dynamic memory, such as random access memory (RAM). The memory 112 may also include static memory, such as read-only memory (ROM). The memory 112 may also include memory cells, caches, buffers, latches, and/or registers, operable with the processor(s) 111.

The storage component(s) 113 may include an electromagnetic disk drive, optical disk media, and/or electronic 'flash' media or the like. Temporary or "virtual" memory may be operable with the disk drives and/or flash media. The non-transitory computer-readable storage media stores instructions and/or data readable by the processor, and operable for causing, controlling, or programming the processor to perform a process related to the managing of the energy usage. The energy management method may relate to the method 30, described herein (FIG. 3). An example embodiment of the present invention relates to the non-transitory computer-readable storage medium storing the instructions.

The energy-using component 144 of the mobile device 100 may be a heater element. The controlled operation relates to changing an operating state of the heater element from an energized state to a deenergized state, or vice versa, from a deenergized state to an energized state. The changing of the operating state of the heater element may be based (at least partially) on the comparison of the monitored environmental characteristic to the sensed characteristic of the mobile device.

The monitored at least one environmental characteristic may be an ambient temperature, a measured humidity level, a computed relative humidity value and/or a local dew point computed in relation to one or more of the ambient temperature, measured humidity level, or the computed relative humidity value.

The mobile device 100 may also include a sensor 119. The sensor 119 is operable for measuring a temperature of the mobile device in accord with the current example embodiment (but element 119 can represent any configuration of one or more sensors consistent with the present teachings). The sensed characteristic in this example may be a temperature of the mobile device. For example, the sensed mobile device 100 characteristic may be the temperature of the surface of the mobile device case 103, or the internal space of the mobile device within the case 103, in which electronic components of the mobile device 100 are disposed. The determining of the action may include computing a dew point based on the sensed mobile device 100 characteristic and the monitored at least one environmental characteristic.

The mobile device 100 may further include one or more network interfaces 118. The network interface(s) is (are) operable for exchanging data signals with the processor 111, and with a network (e.g., network 230; FIG. 2). The data signals relate to the monitoring of at least one environmental characteristic of at least two environments in which the mobile device 100 is operable.

The mobile device 100 also includes a positioning component ("positioner") 117. The positioner 117 is operable in relation to the tracking of the location of the mobile device 100 in relation to the at least two environments. The tracking of the mobile device 100 location may relate to a geopositioning operation. The geopositioning operation may relate to computing the location based on exchanging location related signals with a geopositioning satellite constellation, such as the Global Positioning System (GPS), GLONASS, or the like, and/or with known geostationary radio signal sources, such as cellular telephone towers, and the like. The network interface 118 is operable, further, in relation to the exchange of the locational data signals with the network.

The network interface 118 is operable, further, for exchanging signals with the network in relation to the at least one environmental characteristic of the environment in which the mobile device 100 is located.

The case 103 of the mobile device 100 is disposed about a plurality of, components (e.g., electronic components), which are encased therein, e.g., protectively from environmental conditions and elements in the location in which the mobile device 100 is disposed and/or operated. The mobile device 100 has a data bus 110, operable for exchanging data signals between the electronic components.

A sensor component 119 is coupled to the bus 110 and operable for providing data signals corresponding to a characteristic, such as the local temperature, of the mobile device, e.g., within the case 103, or on at least a portion of a surface thereof.

The example mobile device 100 further includes a display 101. In certain embodiments, the display 101 serves as both a display and a touch panel for accepting user input. An example embodiment may be implemented in which the display 101 may be realized as a liquid crystal display (LCD) device, operable for rendering visible information over a surface of a viewing screen of the LCD. The visible information may include a graphical user interface (GUI) 133. The GUI 133 may be operable for the rendering of the visual information interactively, and for receiving haptically entered user inputs entered therewith. The surface of the viewing screen of the LCD 101 is covered, transparently, with the optically transparent window 102.

The example mobile device 100 incorporates an array of passive optics such as 105 of FIG. 1B. The passive optics 105 may be a lens, or optical stack of a plurality of lenses and other passive optical components or protective transparent window. The passive optics array 105 functions to gather light in relation to operations of the mobile device 100. Such functions may include scanning of graphic media targets, photography, and/or videography, which are associated with capturing visual information from the gathered light. The surface of the passive optics 105 is covered by the optically transparent window 106.

The light gathered by the passive optics 105 may be supplied, optically, to an imaging component ("imager") 116. The imager 116 may include an array of optoelectronic devices. The active optoelectronic devices may include an array of photosensitive devices (photosensors) operable for detecting an image. The photosensors may include a charge coupled device (CCD), complementary metal oxide semiconductor (CMOS), photodiode (PD), charge-injection device (CID), charge modulation device (CMD), P-channel or N-channel metal oxide semiconductor field effect transistor (MOSFET) device, or an array of the devices, such as a video graphics array (VGA). The devices of the array may include a plurality ("two or more") of the CCD, CMOS, PD, CID, CMD, P-channel MOSFET (PMOS), or N-channel MOSFET (NMOS) devices.

Image data generated by the imager 116 in response to the gathered light may be supplied, over the data bus 110, to a camera 115. The camera 115 is operable in relation to the photography, and/or videography operations of the mobile device 100.

Image data generated by the imager 116 in response to the gathered light may be supplied, over the data bus 110, to a scanner 114. The camera 115 and the scanner 114 may be operable in relation to scanning operations carried out by the mobile device 100. For example, the scanner 114 may be operable for reading data associated with graphic scan targets. The graphic scan targets may include, for example, one dimensional (1D) bar codes, and/or two or three dimensional (2D) graphic data patterns, such as Han Xin codes and 'Quick Response' (QR) codes.

The heater or other energy-using component 144 is operable for deterring one or more of a fog condensation or a frost deposit upon the optically transparent window 102 and the window 106. Optics disposed within the case and beneath the windows may thus be maintained clear of fog and/or frost during operations of the mobile device. The operations of the mobile device 100 in relation to the operation of the imager 116, the camera 115, and/or scanner 114 may thus proceed, undeterred, in either environment. The operations of the heater 144 promote undeterred operations of the image sensor, the camera, and the scanner, by deterring the accumulation of fog and/or frost on an outer surface of the windows 102 and 106.

The electronic components of the mobile device 100, and the, e.g., electrical, energy-using component 144 are energized by a battery 145. The battery 145 is an electrochemically operable source of electrical power to energize the mobile device 100 components. The battery 145 may be charged and re-charged from an external source of electrical power, such as a battery charger, via a charging port 149.

The charging port 149 may be operable for connecting the battery 145 to the battery charger by wireline based conductors, or wirelessly from inductive and/or capacitive charging sources.

Embodiments consistent with the present invention function to manage the energy usage of the mobile device 100, in which the consumption of power from the battery 145 by the heaters 145 is minimized, the duration of a given charge of the battery 145 is extended, along with the corresponding time until a recharge becomes appropriate. Example embodiments of the present invention thus relate to methods for managing energy usage by the mobile device 100.

In an example embodiment, the mobile device 100 includes a controller 141. The controller 141 is operable for exchanging data signals with the processor 111 via the data bus 110. The signals exchanged between the controller 141 and the processor 141 relate to the controlling of the energy-using component 144.

The mobile device may further incorporate a switch component 142 or other control component. Based on the signals exchanged with the processor 111, the controller 141 is operable for changing a conductivity state of the switch 142. For example, the controller 141 may triggering the switch 142 to change from a non-conductive state to a high-conductance state, and thus allow power to flow from the batter 145 to the energy-using component 142. The controller 141 may also (or alternatively) cause the switch 142 to change from a high conductance state to a non-conducting state, thus stopping or impeding the flow of power from the battery 145 to the energy-using component 144. In other example embodiments, the element 142 may also vary the current to heater 144 by modulating, current limiting or otherwise reducing the average current supplied to the energy-using component 144. An example embodiment may be implemented in which the switch 142 is implemented as an array of power MOSFET devices, triggered controllably by the controller 141.

An example embodiment of the present invention relates to a system, operable over a network platform, for managing energy usage by a mobile device. Example embodiments of the present invention relate to various network platforms, over which a system is operable for managing a usage of energy by a mobile device. The system includes a network operable for communicating data signals. Example embodiments may be implemented in which the network is a BTLE related network, a network related to a HVAC system, and/or an IOT related internetwork.

Figure 5:
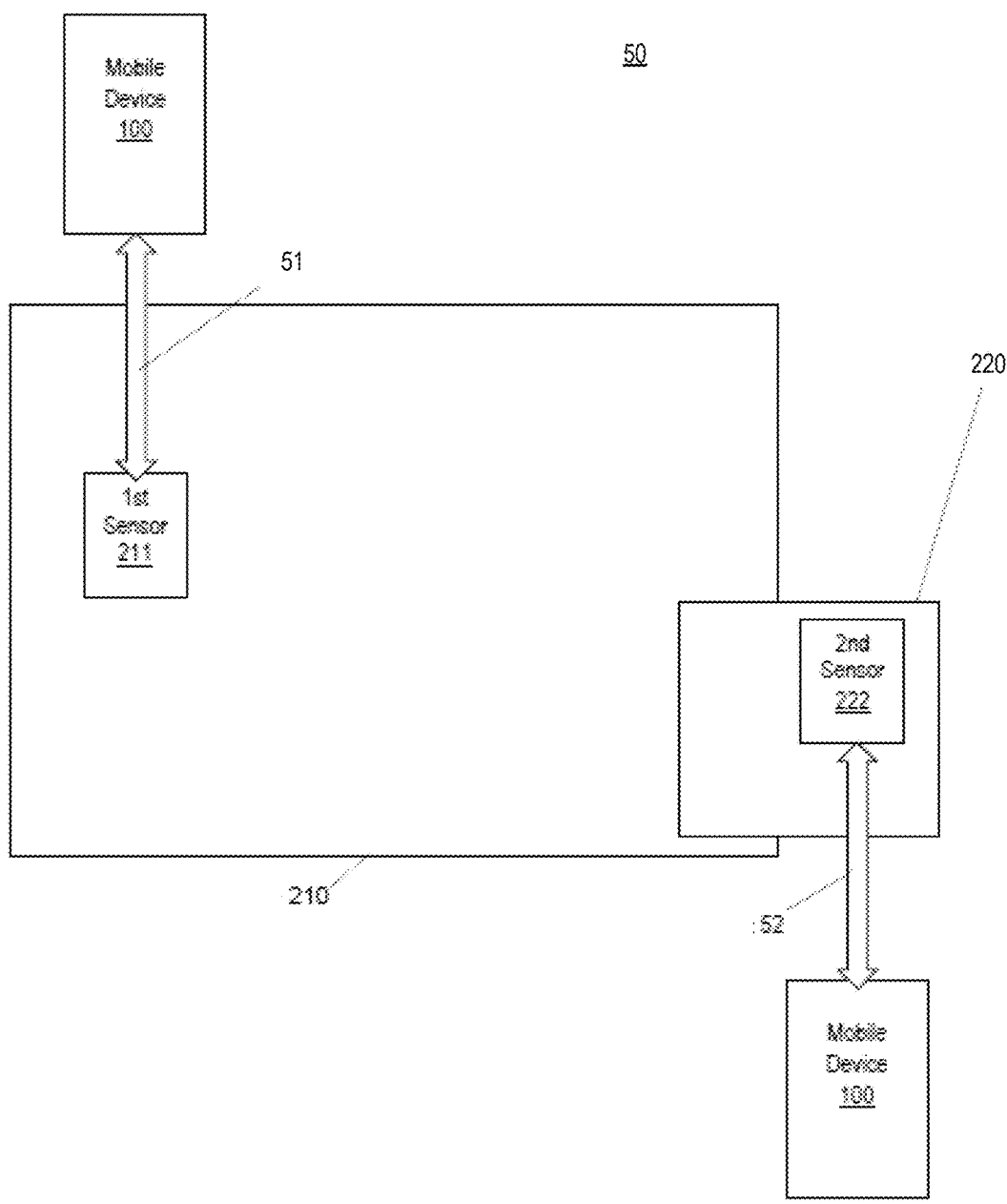
FIG. 5 depicts an example network platform, according to certain embodiments consistent with examples of the present invention.

FIG. 5 depicts an example network platform 50, according to an embodiment of the present invention. The mobile device 100 receives data signals from the sensor 211 in relation to the environmental characteristic of the first environment, within the corresponding envelope 210. The mobile device 100 receives data signals from the sensor 222 in relation to the environmental characteristic of the second environment, within the corresponding envelope 220.

Upon the example network platform 50, the mobile device 100 receives the data signals from the sensor 211, directly, over the BTLE channel 51. Upon the example network platform 50, the mobile device 100 receives the data signals from the sensor 222, directly, over the BTLE channel 52.

Figure 6:
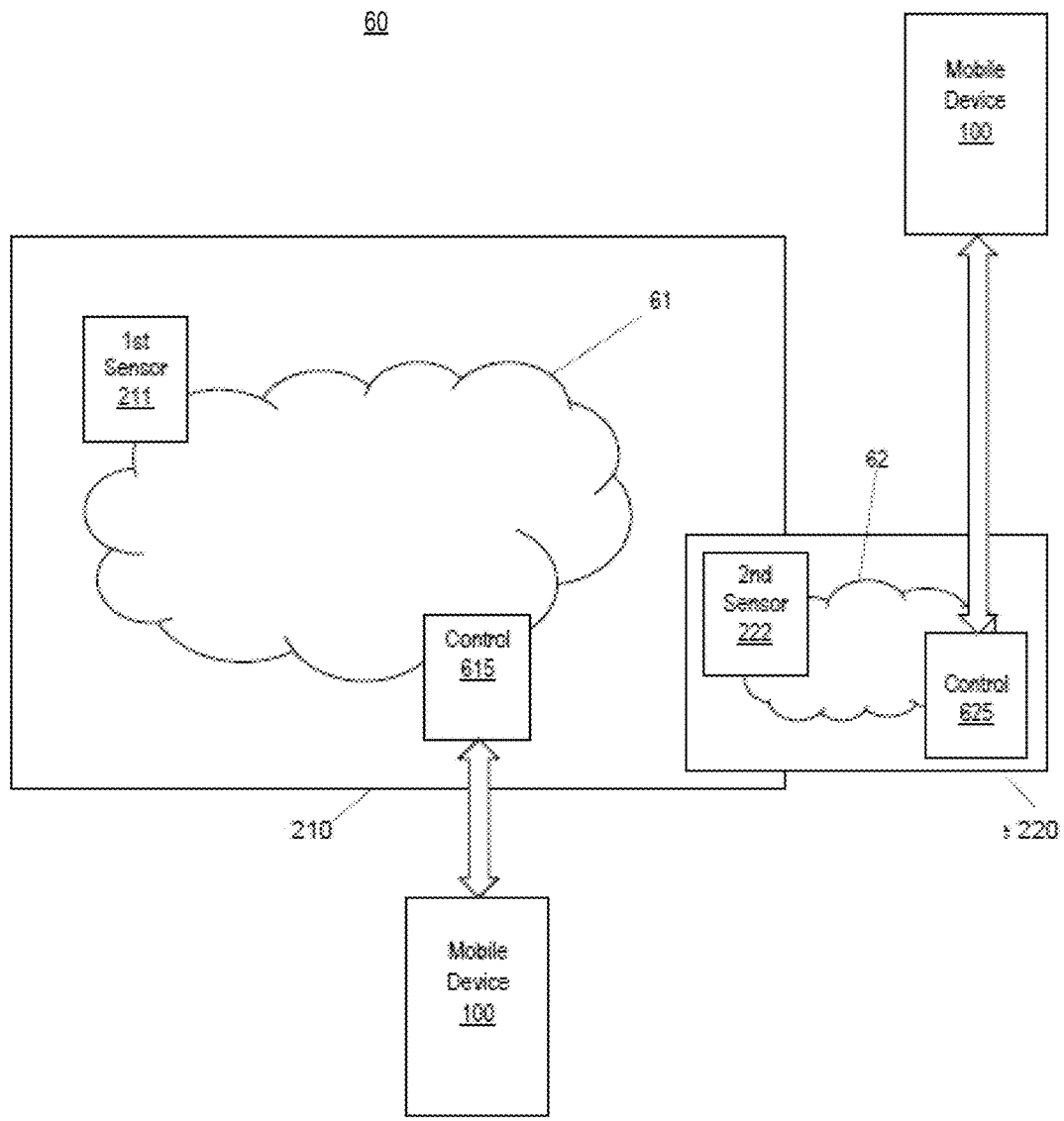
FIG. 6 depicts an example network platform, according to certain embodiments consistent with examples of the present invention.

FIG. 6 depicts an example network platform 60, according to an embodiment of the present invention. The mobile device 100 receives data signals from the sensor 211 in relation to the environmental characteristic of the first environment, within the corresponding envelope 210. The mobile device 100 receives data signals from the sensor 222 in relation to the environmental characteristic of the second environment, within the corresponding envelope 220.

Upon the example network platform 60, the mobile device 100 receives the data signals from the sensor 211, via a control server 615, associated with a first HVAC subnetwork ("subnet") 61. Upon the example network platform 60, the mobile device 100 receives the data signals from the sensor 222, via a control server 625, associated with a second HVAC subnet 62. The subnet 61 and the subnet 62 may include portions of the network 230 (FIG. 2), the Internet, etc.

Figure 7:
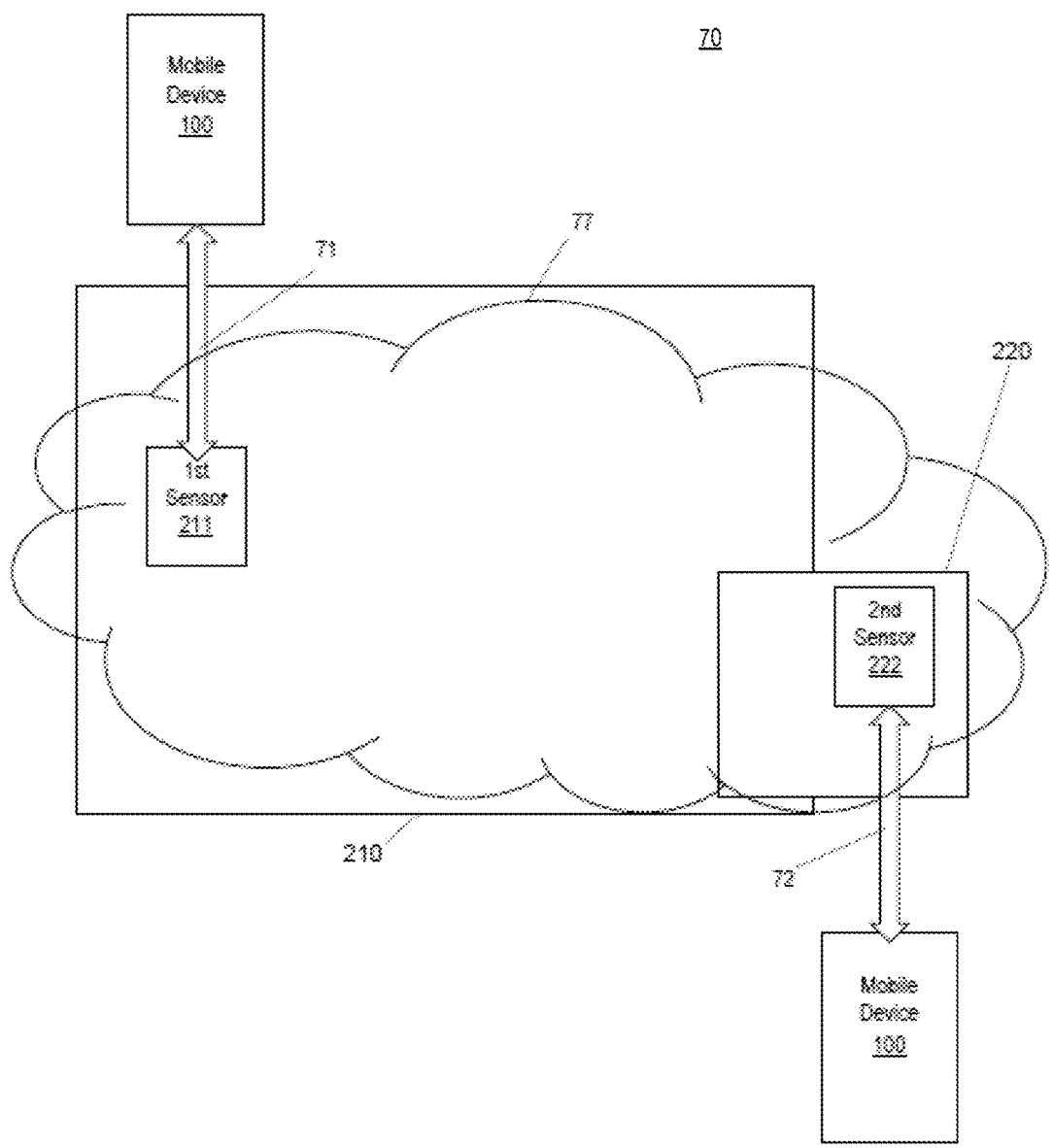
FIG. 7 depicts an example network platform, according to certain embodiments consistent with examples of the present invention.

FIG. 7 depicts an example network platform 70, according to an embodiment of the present invention. The network platform 70 includes the IOT 77. The example mobile device 100 receives data signals from the sensor 211 in relation to the environmental characteristic of the first environment, within the corresponding envelope 210. Upon the example network platform 70, the mobile device 100 receives the data signals from the sensor 211 over the IOT 77. The mobile device 100 receives data signals from the sensor 222 in relation to the environmental characteristic of the second environment, within the corresponding envelope 220. Upon the example network platform 70, the mobile device 100 receives the data signals from the sensor 222 over the IOT 77. The IOT may include a portion of the network 230 (FIG. 2), the Internet, etc.

In the embodiments described above, environmental and location data are used to determine that the example mobile device 100 is situated in an environment in which fogging or frosting may occur. This information is then used to control a heater so as to address this potential for fogging or frosting.

In another example embodiment the sensor(s) 119, rather than or in addition to being a temperature sensor for example, may include a fog/frost sensor that detects actual fogging or frosting of components associated with the display 101 or other components. In one example, a change in temperature may be used to deduce that there is a likelihood of fog or frost on a surface (e.g., the display window), while in another example sensors 119 detect the actual presence of fog or frost. In this embodiment ambient environmental information as well as available power capabilities may be used to control the heater elements. This intelligent control maximizes run time while addressing fogging and frosting in these environments.

In one example embodiment, the system utilizes thermal monitoring of the screen window 102 and/or imager window 106 to recognize when a cold to warm transition has occurred. One embodiment of this temperature monitor utilizes an infrared (IR) temp sensor monitoring the cover glass of the display for example. In another embodiment the sensor could be an optical or ultrasound sensor to determined fog or frost has formed on the surface. The heater elements can then be used selectively to assure minimal power consumption.

The processor may also monitor the battery temperature and remaining battery capacity. The processor uses this information to determine how much power is available from the battery. Under ideal power and temperature conditions the heater can be run at maximum power speeding up the defogging process. But, when the battery temperature and or battery capacity levels are low, the control circuits can decrease the power applied to the heater element, providing some level of defogging capability without causing the system to power down due to low voltage.

Figure 8:
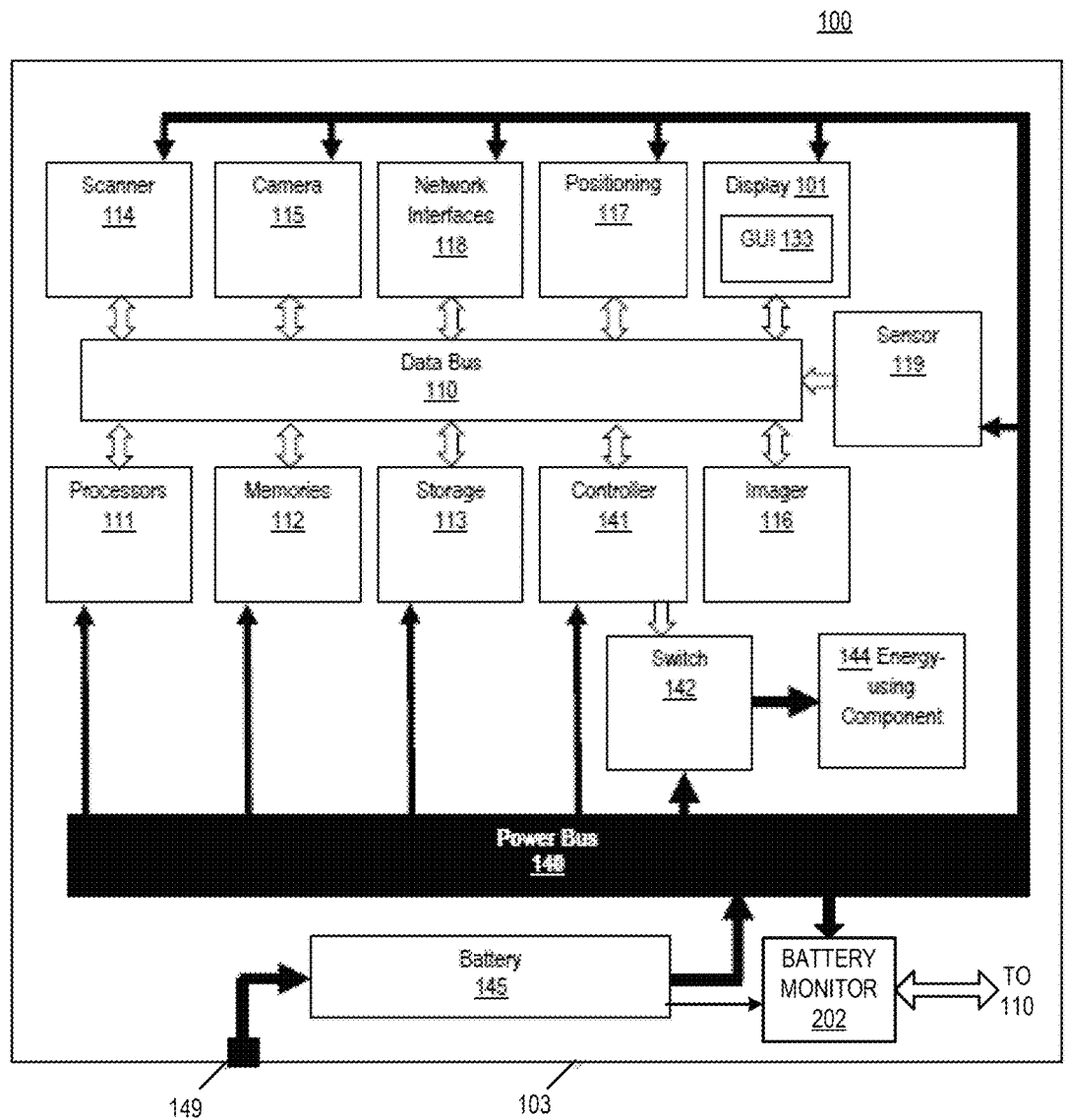
FIG. 8 depicts example components of the mobile device, according to certain embodiments consistent with examples of the present invention.

Referring to FIG. 8, the example mobile device 100 incorporates a sensor 119 which may be a temperature sensor such as an IR temperature sensor that directly measures the temperature of the window 102 (FIG. 1) or the temperature of the passive optics 105 and/or transparent window 106 or any other component that may be subject to fogging or frosting. The temperature of, for example, the window 102 can be monitored over time and when a large enough temperature change over a short time period occurs such that the window 102 is subject to fogging or frosting, the heater 144 can be activated. When the condition in which the fogging or frosting is likely to occur has passed, the heater can be deactivated. The charge state and other measurements associated with the battery may be obtained from a battery monitoring circuit 202 so as to establish other conditions governing use of the heater. Such battery monitoring circuits are commercially available and are often referred to as a "battery fuel gauge" or the like and are commonly integrated into battery packs to provide information about the battery. The battery monitoring circuit will be discussed in greater detail later.

Figure 9:
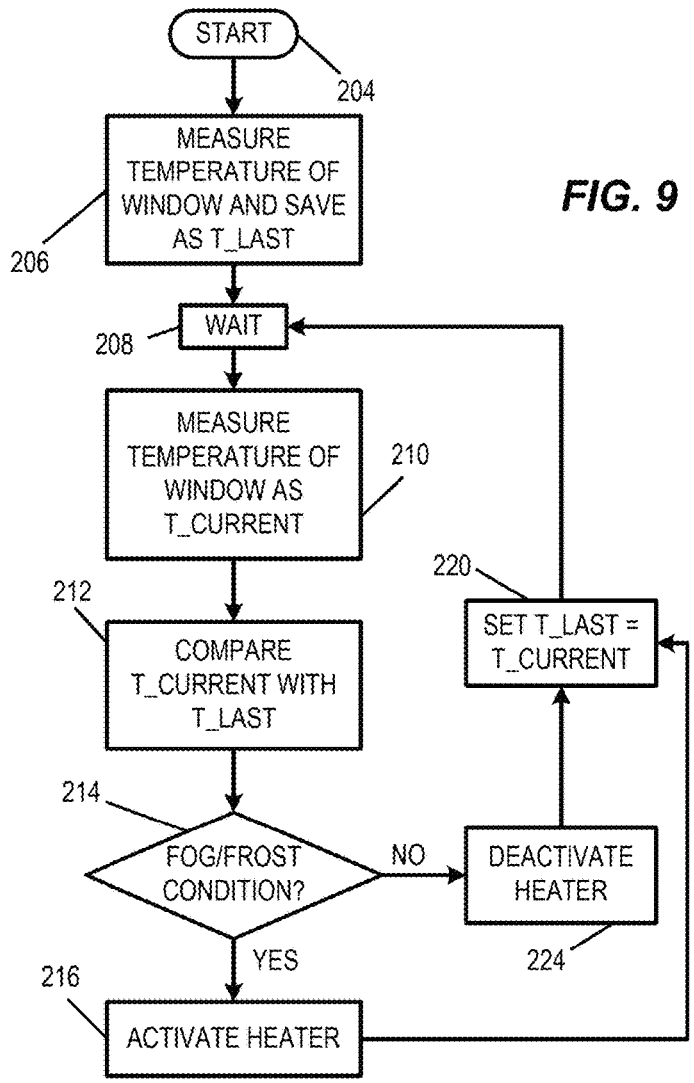
FIG. 9 is an example flow chart of a process consistent with certain example embodiments consistent with the present invention.

FIG. 9 is an example of one process consistent with this embodiment starting at 204. In this example, the temperature of a surface such as window 102 or 106 is monitored by sensor 119 and this temperature is saved as T_Last. The process waits for a prescribed period of time (e.g., two seconds) at 208 and then moves to 210 where the temperature of the same surface is measured again. This new measurement is referenced herein as T_Current. At 212, T_Current is compared to T_Last (the previous measurement) to determine if there has been a change, how much the change is and if the temperature increased or decreased. With this information the processor(s) 111 can determine if the conditions are likely to produce a fog or frost condition on the window at 214.

In this example, if a fog or frost condition is established at 214, the heater 144 can be activated at 216. As will be discussed later, the activation of the heater may be further subject to other conditions such as the state of charge of the battery and temperature thereof. Moreover, the heater may be activated to less than 100% of its capacity in order to preserve battery charge or minimize peak power drain under some circumstances. But for the present embodiment, the heater is activated at 216 and the value of T_Last is changed to the most recent measurement T_Current at 220. The process then proceeds to 208 and repeats.

In the event the processor 111 determines at 214 that no frost or fog condition exists, the heater can be deactivated at 224.

In this example, a fog or frost condition may be deemed to exist if, for example, the temperature changes by for example a rise in temperature of $\Delta T=3°$ C. in two seconds as might occur if the device 100 is taken from a walk-in freezer to a heated space or outdoors, or taken from outdoors in freezing conditions to a heated interior. (However, the actual temperature change over time should likely be calibrated for a particular device and set of anticipated environmental circumstances.) Under these circumstances the heater can be activated for a period of time that will serve to prevent or remove fog or frost. In one embodiment, the process 214 determines if a fog or frost condition has passed by determining that the window has reached a prescribed temperature associated with a likelihood of the fog or frost being cleared T_Clear of, for example, 25° C.

The occurrence of fog or frost can vary greatly depending upon humidity as well as temperature change. In the present embodiment, the amount of temperature change that signifies that a fog or frost condition might occur varies with the environment. So, for example, a temperature increase of 10° C. over the course of a few seconds might cause fogging in a high humidity environment such as in tropical South Florida. But, a similar temperature change in a low humidity environment such as the Arizona desert may require a much larger temperature swing to induce fog. Accordingly, it is desirable for the sensitivity of the temperature change measurement to be adjustable by the user or other entity that configures the mobile device 100.

In the example provided, only one pair of temperature measurements are used at a time to carry out the process. However, those skilled in the art will appreciate upon consideration of the present teachings that a plurality of measurements over a longer span of time may be used to better characterize the temperature changes and provide a more optimal process. Furthermore, it is noted that it is desirable to incorporate a level of hysteresis into the process to assure that the system does not become unstable.

In another example embodiment, the actual presence of fog or frost on window 102 or 106 can be used to determine that the heater 144 should be activated or deactivated. In this example embodiment, example mobile device 100 incorporates a sensor as sensor(s) 119 which is capable of examining the window 102 and/or 106 (or other surface susceptible to fog or frost) for the presence of fog or frost. A number of different types of sensors can be utilized to detect fog or frost including, but not limited to, optical sensors, ultrasonic sensors, capacitive sensors, etc. In one example embodiment, such detection can be done optically by use of an optical sensor as sensor 119. Advantageously, the window 106 may cover a suitable optical sensor for examination of the window 106 for frost or fog. A second sensor can be provided for window 102 or the system can rely upon a single sensor as an indicator that there is a fog or frost problem.

In this example embodiment, the visible/optical characteristics of the window when in a frosted or fogged condition are characterized. Generally, during a full fog or frost, the window will be white with few visible color or brightness transitions. Moreover, images beyond the window are not visible. When such an image is recognized by processor(s) 111, the window is deemed to be fogged or frosted. The fogging or frosting process may be detected as it is happening if substantial portions of the window exhibit fog or frost properties and in particular if the portion of the window exhibiting fog or frost properties is rapidly increasing in area. When the fogging or frosting is being removed by heater 144, the amount of white area in the image will diminish until the system can deem that the process for removal of the fog or frost is complete. In order to preserve battery charge further, the heater 144 may be activated by less than 100% of its full heating capacity (e.g., 50%).

In another embodiment, an ultrasound sensor can be utilized as sensor 119. Fog or frost can be detected using a continuously vibrating ultrasound sensor diaphragm which is forced into oscillation at its resonant or natural frequency by a piezoelectric material. In this example, the diaphragm is exposed to the environment outside the case of device 100. The piezoelectric material is driven by an electronic oscillator. The resonant frequency is ultrasonic (above 70 kHz) and the maximum oscillation amplitude is very small (under 1 micrometer) so that effectively there are no moving parts. When frost is deposited on the sensor diaphragm, it increases the stiffness and mass of the diaphragm, hence increasing the natural resonant frequency. Water or liquid contaminants increase the sensor diaphragm mass without increasing the stiffness thus decreasing the natural frequency. Thus, a change in the natural resonant frequency of the ultrasound sensor is indicative of a deposit of frost or fog onto the sensor.

In another example embodiment, a pulse-amplitude technique can be used. A piezoelectric ceramic crystal (PCC) acts as a transmitter and launches an ultrasonic pulse through a delay line to the surface being monitored. After initial excitation, the PCC acts as a receiver and detects an echo returning from the surface. The delay line guarantees that the PCC has recovered from the initial excitation before it receives the returning echo. When an air interface is present at the surface being measured (i.e., no frost) a maximum amount of energy is reflected. When frost is present, approximately 30 percent of the transmitted ultrasonic energy propagates in the ice, thus reducing the level of the reflected signal the PCC receives. This level reduction provides an indication of the presence of thin ice layers (frost). Once the ice has exceeded the threshold thickness, the sensor continues to detect the presence of ice. The presence of fog also affects the reflected energy. Detection of the changes caused by fog can also be characterized and used as an indication that a heating element should be activated.

In another embodiment, a pulse-echo technique can be used. In this technique, there are two PCC's. One acts as a pulse transmitter, and the other acts as a pulse echo receiver. A high-frequency excitation signal is sent to the first PCC, which transmits an acoustic pulse toward the sensing surface. Either the sensing face or the surface of the frost, when frost is present, reflects the acoustic pulse. The second PCC receives the returning echo. The processor measures the transit time between excitation and receipt of the returning echo, thereby determining the amount of accumulated ice (frost). The presence of fog also affects this transit time and can be characterized for a particular device to determine that fog is present.

Figure 10:
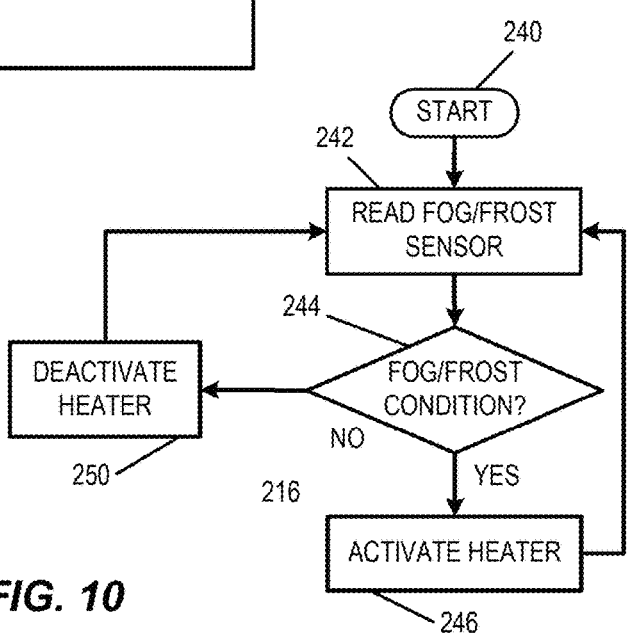
FIG. 10 is another example flow chart of a process consistent with certain example embodiments of the present invention.

Hence, in the present embodiment the sensor 119 detects the actual presence of fog or frost on a surface such as the display window 102 and this detection is used to control the heater 144 as depicted in the example flow chart of FIG. 10 starting at 240. While optical and ultrasound techniques are described above, other sensing operations might also be used to sense the presence of fog or frost (e.g., conductivity, reflectivity, etc.) At 242 the sensor is read to obtain data that is analyzed at 244 to determine if a fog or frost condition exists. If so, the heater 144 is activated at 246 until the fog/frost condition is gone at 244. Once the sensor data indicates that there is no longer a fog or frost condition at 244, the heater can be deactivated at 250.

In this example, if a fog or frost condition is established at 244, the heater 144 can be activated at 246. As will be discussed later, the activation of the heater may be further subject to other conditions such as the state of charge of the battery and temperature thereof.

Furthermore, it is noted that in all embodiments it is desirable to incorporate a level of hysteresis into the process of turning the heater on and off to assure that the system does not become unstable.

It should be apparent from the discussion above, the power consumed by a heater element in combating fog and frost can be substantial in some situations for a mobile device 100 and can result in decreased time between charges and shorter run time. However, it may be desirable to manage power consumption not only for a display heater element or the like but additionally for any number of other systems that consume power within a mobile device 100. In the device shown in FIG. 8, for example, in addition to the heater (energy-using component) 144, there are a number of other systems that can consume significant amounts of battery power. Some of these systems use power in bursts while others may consume a relatively consistent amount of power. For example, scanner 114 and camera 115 may only consume significant power when used. The display 101 when active, may consume considerable power for backlighting. The processor 111 may operate at multiple processor(s) speeds so that the power consumed can be limited at the expense of performance.

The mobile device 100 may also incorporate multiple radio interfaces including Bluetooth, IEEE 802.11 compatible interface, WAN interface and near field communications interface. Depending upon the primary function of device 100, these interfaces may or may not be required to be active at all times. Moreover, such systems normally consume more power when transmitting than when receiving or standing by. Transmission can often be postponed for short periods without serious impact on the functionality of the device.

When the mobile device consumes high amounts of peak power during normal operation, such peak power events can cause the mobile device 100 to suspend or shut down even though there may be substantial battery power remaining. In some devices, a peak power event can cause the device to shut down when there is 30% or more capacity left in the battery. This early shut down generally forces the user to interrupt his normal activities to change the battery pack or recharge the battery before the day's work is completed.

In order to more fully take advantage of battery capacity, in certain embodiments consistent with the present invention the system recognizes factors that can cause early power down events. Power management directed toward the specific systems or processes in the mobile device 100 can be used to reduce or ameliorate peak power events that could result in early shut down of the device. In certain embodiments, this power management allows the user to utilize more of the battery's capacity and improve run time.

Referring back to FIG. 8, the battery monitor 202 is implemented using any suitable battery monitoring circuit (discrete or integrated). Such circuits can commonly report a great deal of information regarding the battery pack including temperature, voltage, discharge data that characterizes the battery's discharge curve, and data logging functions. The battery monitor 202 reports the data relating to the battery to the processor 111 via data bus 110 in this example. Temperature can be measured using a thermistor that is incorporated into the circuit while terminal voltage can be measured directly at the battery terminals. Instantaneous current draw can be measured by detecting the voltage across a very small resistance in series with the battery and calculating the current using Ohm's law.

In accord with certain embodiments, the processor 101 receives or retrieves data that reports the battery's average temperature, terminal voltage, and current draw to create a battery power factor (referred to herein as BATT_PWR_FACTOR) that may be used to recognize power states in which the computer can cause an early power down event. The processor then controls the device's power consumption by use of a prioritization of the functions and systems operating on the device that can be disabled or scaled back.

In certain embodiments, each sub-system or process within the device 100 can be assigned one or more priorities associated with its operational state. The processor 101 looks at the priority assigned to of each individual device and reduces the power level of the lowest priority devices in accord with a power management arrangement. BATT_P-

WR_FACTOR can then be re-checked to determine if additional devices or systems should be powered down or power reduced. This process proceeds until a target power consumption is reached. The power consumption can thereby dynamically adapt the power level to increase the useful battery life based on present conditions.

Figure 11:
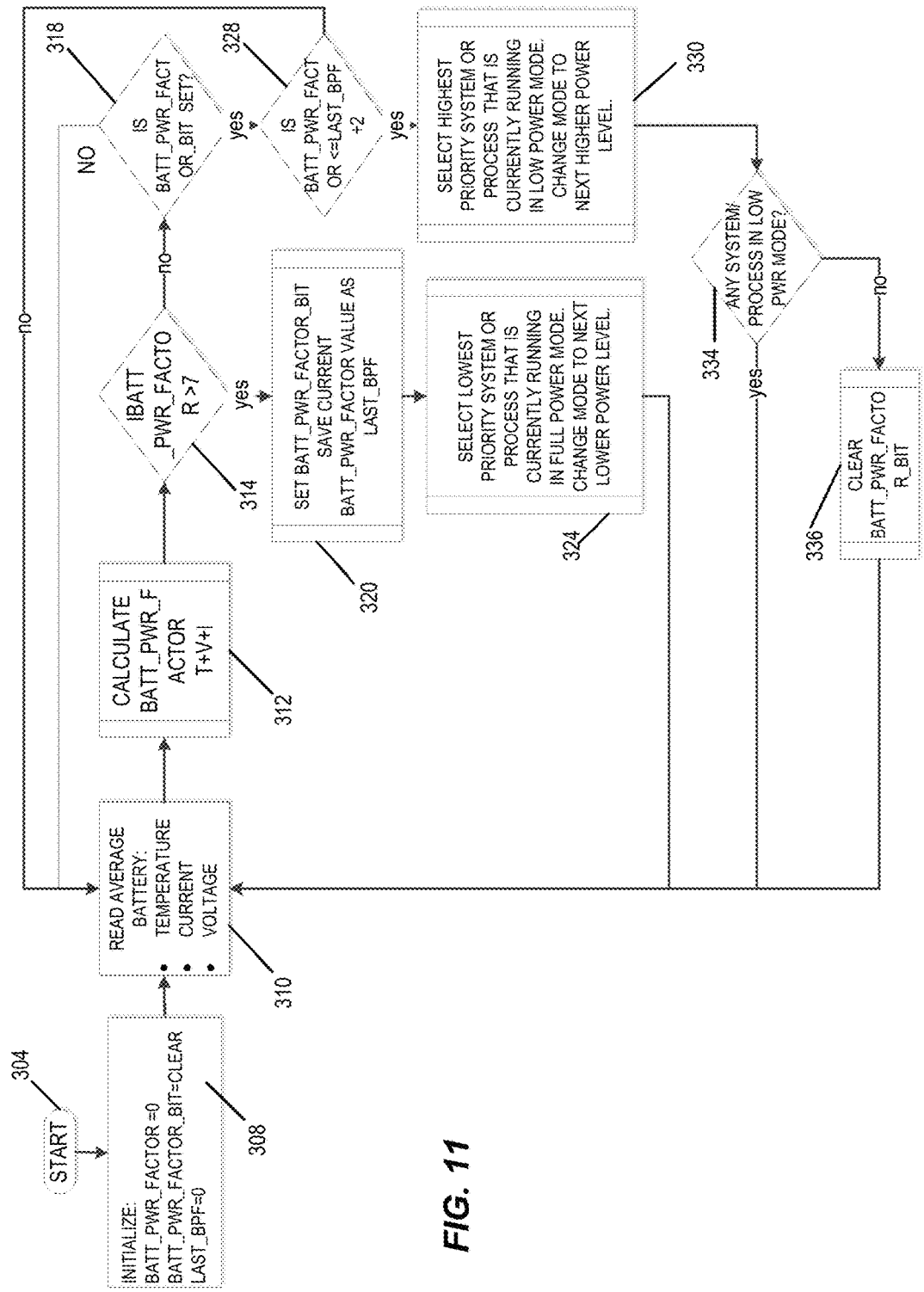
FIG. 11 is an example flow of a process consistent with certain example embodiments of the present invention.

A process for carrying out a power management function is depicted in FIG. 11 in flow chart form starting at 304.

In accord with the present teachings, the priorities for various systems and processes that can be managed may be stored in a look-up table stored in memory 112 or storage 113. An example priority table is depicted as TABLE 1. Additionally, the BATT_PWR_FACTOR can be determined from data reported by battery monitor 202 for voltage, current and temperature. In this example embodiment, a battery power factor BATT_PWR_FACTOR can be computed from the voltage, current, and temperature data as shown in TABLE 2.

TABLE 1 as depicted below provides a priority list with a numerical designation of priority. In the example shown, the lower the priority number in this example, the lower the priority of a particular system or process. As the process of FIG. 11 describes, when the BATT_PWR_FACTOR exceeds a threshold, systems or processes can be controlled to reduce their respective power consumption until the BATT_PWR_FACTOR is reduced to a prescribed value. In this manner, the peak power consumption can be managed.

TABLE 1

Example Priority List User could select other priority levels

| Device Power State | Priority |
|---|---|
| CPU SPEED 60% | 12 |
| CPU SPEED 30% | 1 |
| Backlight reduced to minimum. | 10 |
| Backlight blanked when scanning. | 2 |
| Scanner Disabled | 3 |
| WAN Disabled | 4 |
| WAN cycled off for extended periods. | 8 |
| 802.11 Disabled | 5 |
| 802.11 cycled off for extended periods | 7 |
| Speaker Volume reduced to minimum | 11 |
| Haptics disabled | 6 |
| BT radio disabled | 9 |
| NFC radio Disabled | 13 |
| Camera disabled | 15 |
| Other devices disabled | 14 |
| Heater @ 100% | 17 |
| Heater @ 50% Duty Cycle | 16 |

In this example, system the lowest priority action is related to the clock speed of processor 101. Based on this prioritization, when the BATT_PWR_FACTOR exceeds a prescribed threshold, the first action taken by the power management process is to reduce the clock speed to the processor by 30% (Priority 1). If this is not adequate to bring the BATT_PWR_FACTOR down to an acceptable range, the backlight is blanked when scanning (Priority 2). If this is not adequate to bring the BATT_PWR_FACTOR down to an acceptable range, the scanner is disabled (Priority 3) and so on. These priorities may be user manipulated or factory set.

In this example, the BATT_PWR_FACTOR is computed by first reading the temperature, voltage, and current from battery monitor 202. TABLE 2 below shows example ranges of temperature, voltage and current for this example battery pack and factors T, V and I representing a figure of merit ranging from values of 1 to 8 for each. These values can be user manipulated or factory set.

TABLE 2

Table used to calculate BATT_PWR_FACTOR.
All measurements are 5 second running averages.
T + V + I = BATT_PWR_FACTOR

| Temperature | Factor (T) |
|---|---|
| T >= 10 C. | 1 |
| −5 C. < T < 10 C. | 3 |
| T <= −5 C. | 8 |

| Voltage | Factor (V) |
|---|---|
| V >= 3.8 V | 1 |
| 3.5 V < V < 3.8 V | 3 |
| V <= 3.5 V | 8 |

| Current | Factor (I) |
|---|---|
| I <= 400 mA | 1 |
| 400 mA < I < 800 mA | 3 |
| I >= 800 mA | 8 |

The battery power factor is then computed as:

BATT_PWR_FACTOR=$T+V+I$.

Thus, if the temperature is between −5° C. and 10° C., the voltage is greater than 3.8 volts and the current is less than 400 mA, the value of BATT_PWR_FACTOR would be computed as:

BATT_PWR_FACTOR=3+1+1=5.

This BATT_PWR_FACTOR is tested against a prescribed threshold (7 in the example shown) to determine if systems or processes should be shut down or changed.

Returning to FIG. 11, at 308 the power management process is initialized by setting BATT_PWR_FACTOR=0. Whenever the threshold for the battery power factor has been exceeded, a BATT_PWR_FACTOR_BIT is set to one, so at initialization at 308, the BATT_PWR_FACTOR_BIT is initialized to zero. In addition, the process uses an earlier version of the battery power factor (before the most recent change) and that value is designated LAST_BPF. At 308, this value is also initialized to zero. Control then passes to 310

At 310, the battery temperature, voltage, and current are read from battery monitor 202 and the BATT_PWR_FACTOR is computed at 312.

Once the BATT_PWR_FACTOR has been calculated at 312, it is compared to a threshold at 314 (which may be factory set or user manipulated) and in this example is set to 7. If the BATT_PWR_FACTOR does not exceed this threshold at 314, the process proceeds to 318.

At 318, the BATT_PWR_FACTOR_BIT is inspected and if it is not set to 1, the process returns to 310 for a next battery data reading.

At 320, if the BATT_PWR_FACTOR exceeded the threshold at 314 then the current BATT_PWR_FACTOR is saved as LAST_BPF and the BATT_PWR_FACTOR_BIT is set to 1 and the process proceeds to 324.

At 324, the lowest priority system that is running in full power mode is changed (e.g., the processor clock speed is lowest priority and the processor clock speed is the first change made by reducing the clock speed by 30%). The change will take the target system or process to a lower power state (in this example, a lower clock speed). When this system or process change is made, the process goes back to 310 to again check the battery data. This aids in determining the effectiveness of each incremental reduction in power.

Returning to 318, if the BATT_PWR_FACTOR_BIT is set to (as it will be on at least the first cycle through the process after the bit has been set at 320), then the BATT_PWR_FACTOR is compared to LAST_BPF+2 at 328. The requirement that the BATT_PWR_FACTOR be at most two less than the LAST_BPF adds hysteresis to the system to prevent instability. When this requirement is met at 330, the process can begin to re-activate systems that have been turned off and resume a higher power consumption rate for systems that have been compromised to reduce power (e.g., return the processor to 100% clock speed). Hence, at 330, the highest priority system is restored to full power and the process goes to 334.

If any systems or processes are still in a lower power mode at 334, the process returns to 310 for the next reading of battery data. If on the other hand, there are no systems or processes that remain in the lower power mode (including inactivated) at 334, then the BATT_PWR_FACTOR_BIT is cleared to zero and the process returns to 310.

In the example provided, the terminal voltage, current drain, and temperature of the battery are measured by the battery monitor device. However, in other embodiments fewer or more battery characteristics can be measured. For example, in the case where the battery monitor circuit 202 maintains data representing a battery's discharge curve, the battery's current position on the discharge curve can be used instead of or in addition to the other data discussed. In other example embodiments, a single battery measurement (e.g., terminal voltage or temperature) or a combination of two or more battery characteristics can be used to create a battery power factor without limitation.

To supplement the present disclosure, this application incorporates entirely by reference the following commonly assigned patents, patent application publications, and patent applications:

U.S. Pat. No. 6,832,725; U.S. Pat. No. 7,128,266;
U.S. Pat. No. 7,159,783; U.S. Pat. No. 7,413,127;
U.S. Pat. No. 7,726,575; U.S. Pat. No. 8,294,969;
U.S. Pat. No. 8,317,105; U.S. Pat. No. 8,322,622;
U.S. Pat. No. 8,366,005; U.S. Pat. No. 8,371,507;
U.S. Pat. No. 8,376,233; U.S. Pat. No. 8,381,979;
U.S. Pat. No. 8,390,909; U.S. Pat. No. 8,408,464;
U.S. Pat. No. 8,408,468; U.S. Pat. No. 8,408,469;
U.S. Pat. No. 8,424,768; U.S. Pat. No. 8,448,863;
U.S. Pat. No. 8,457,013; U.S. Pat. No. 8,459,557;
U.S. Pat. No. 8,469,272; U.S. Pat. No. 8,474,712;
U.S. Pat. No. 8,479,992; U.S. Pat. No. 8,490,877;
U.S. Pat. No. 8,517,271; U.S. Pat. No. 8,523,076;
U.S. Pat. No. 8,528,818; U.S. Pat. No. 8,544,737;
U.S. Pat. No. 8,548,242; U.S. Pat. No. 8,548,420;
U.S. Pat. No. 8,550,335; U.S. Pat. No. 8,550,354;
U.S. Pat. No. 8,550,357; U.S. Pat. No. 8,556,174;
U.S. Pat. No. 8,556,176; U.S. Pat. No. 8,556,177;
U.S. Pat. No. 8,559,767; U.S. Pat. No. 8,599,957;
U.S. Pat. No. 8,561,895; U.S. Pat. No. 8,561,903;
U.S. Pat. No. 8,561,905; U.S. Pat. No. 8,565,107;
U.S. Pat. No. 8,571,307; U.S. Pat. No. 8,579,200;
U.S. Pat. No. 8,583,924; U.S. Pat. No. 8,584,945;
U.S. Pat. No. 8,587,595; U.S. Pat. No. 8,587,697;
U.S. Pat. No. 8,588,869; U.S. Pat. No. 8,590,789;
U.S. Pat. No. 8,596,539; U.S. Pat. No. 8,596,542;
U.S. Pat. No. 8,596,543; U.S. Pat. No. 8,599,271;
U.S. Pat. No. 8,599,957; U.S. Pat. No. 8,600,158;
U.S. Pat. No. 8,600,167; U.S. Pat. No. 8,602,309;
U.S. Pat. No. 8,608,053; U.S. Pat. No. 8,608,071;
U.S. Pat. No. 8,611,309; U.S. Pat. No. 8,615,487;
U.S. Pat. No. 8,616,454; U.S. Pat. No. 8,621,123;
U.S. Pat. No. 8,622,303; U.S. Pat. No. 8,628,013;
U.S. Pat. No. 8,628,015; U.S. Pat. No. 8,628,016;
U.S. Pat. No. 8,629,926; U.S. Pat. No. 8,630,491;
U.S. Pat. No. 8,635,309; U.S. Pat. No. 8,636,200;
U.S. Pat. No. 8,636,212; U.S. Pat. No. 8,636,215;
U.S. Pat. No. 8,636,224; U.S. Pat. No. 8,638,806;
U.S. Pat. No. 8,640,958; U.S. Pat. No. 8,640,960;
U.S. Pat. No. 8,643,717; U.S. Pat. No. 8,646,692;
U.S. Pat. No. 8,646,694; U.S. Pat. No. 8,657,200;
U.S. Pat. No. 8,659,397; U.S. Pat. No. 8,668,149;
U.S. Pat. No. 8,678,285; U.S. Pat. No. 8,678,286;
U.S. Pat. No. 8,682,077; U.S. Pat. No. 8,687,282;
U.S. Pat. No. 8,692,927; U.S. Pat. No. 8,695,880;
U.S. Pat. No. 8,698,949; U.S. Pat. No. 8,717,494;
U.S. Pat. No. 8,717,494; U.S. Pat. No. 8,720,783;
U.S. Pat. No. 8,723,804; U.S. Pat. No. 8,723,904;
U.S. Pat. No. 8,727,223; U.S. Pat. No. D702,237;
U.S. Pat. No. 8,740,082; U.S. Pat. No. 8,740,085;
U.S. Pat. No. 8,746,563; U.S. Pat. No. 8,750,445;
U.S. Pat. No. 8,752,766; U.S. Pat. No. 8,756,059;
U.S. Pat. No. 8,757,495; U.S. Pat. No. 8,760,563;
U.S. Pat. No. 8,763,909; U.S. Pat. No. 8,777,108;
U.S. Pat. No. 8,777,109; U.S. Pat. No. 8,779,898;
U.S. Pat. No. 8,781,520; U.S. Pat. No. 8,783,573;
U.S. Pat. No. 8,789,757; U.S. Pat. No. 8,789,758;
U.S. Pat. No. 8,789,759; U.S. Pat. No. 8,794,520;
U.S. Pat. No. 8,794,522; U.S. Pat. No. 8,794,525;
U.S. Pat. No. 8,794,526; U.S. Pat. No. 8,798,367;
U.S. Pat. No. 8,807,431; U.S. Pat. No. 8,807,432;
U.S. Pat. No. 8,820,630; U.S. Pat. No. 8,822,848;
U.S. Pat. No. 8,824,692; U.S. Pat. No. 8,824,696;
U.S. Pat. No. 8,842,849; U.S. Pat. No. 8,844,822;
U.S. Pat. No. 8,844,823; U.S. Pat. No. 8,849,019;
U.S. Pat. No. 8,851,383; U.S. Pat. No. 8,854,633;
U.S. Pat. No. 8,866,963; U.S. Pat. No. 8,868,421;
U.S. Pat. No. 8,868,519; U.S. Pat. No. 8,868,802;
U.S. Pat. No. 8,868,803; U.S. Pat. No. 8,870,074;
U.S. Pat. No. 8,879,639; U.S. Pat. No. 8,880,426;
U.S. Pat. No. 8,881,983; U.S. Pat. No. 8,881,987;
U.S. Pat. No. 8,903,172; U.S. Pat. No. 8,908,995;
U.S. Pat. No. 8,910,870; U.S. Pat. No. 8,910,875;
U.S. Pat. No. 8,914,290; U.S. Pat. No. 8,914,788;
U.S. Pat. No. 8,915,439; U.S. Pat. No. 8,915,444;
U.S. Pat. No. 8,916,789; U.S. Pat. No. 8,918,250;
U.S. Pat. No. 8,918,564; U.S. Pat. No. 8,925,818;
U.S. Pat. No. 8,939,374; U.S. Pat. No. 8,942,480;
U.S. Pat. No. 8,944,313; U.S. Pat. No. 8,944,327;
U.S. Pat. No. 8,944,332; U.S. Pat. No. 8,950,678;
U.S. Pat. No. 8,967,468; U.S. Pat. No. 8,971,346;
U.S. Pat. No. 8,976,030; U.S. Pat. No. 8,976,368;
U.S. Pat. No. 8,978,981; U.S. Pat. No. 8,978,983;
U.S. Pat. No. 8,978,984; U.S. Pat. No. 8,985,456;
U.S. Pat. No. 8,985,457; U.S. Pat. No. 8,985,459;
U.S. Pat. No. 8,985,461; U.S. Pat. No. 8,988,578;
U.S. Pat. No. 8,988,590; U.S. Pat. No. 8,991,704;
U.S. Pat. No. 8,996,194; U.S. Pat. No. 8,996,384;
U.S. Pat. No. 9,002,641; U.S. Pat. No. 9,007,368;
U.S. Pat. No. 9,010,641; U.S. Pat. No. 9,015,513;
U.S. Pat. No. 9,016,576; U.S. Pat. No. 9,022,288;

U.S. Pat. No. 9,030,964; U.S. Pat. No. 9,033,240;
U.S. Pat. No. 9,033,242; U.S. Pat. No. 9,036,054;
U.S. Pat. No. 9,037,344; U.S. Pat. No. 9,038,911;
U.S. Pat. No. 9,038,915; U.S. Pat. No. 9,047,098;
U.S. Pat. No. 9,047,359; U.S. Pat. No. 9,047,420;
U.S. Pat. No. 9,047,525; U.S. Pat. No. 9,047,531;
U.S. Pat. No. 9,053,055; U.S. Pat. No. 9,053,378;
U.S. Pat. No. 9,053,380; U.S. Pat. No. 9,058,526;
U.S. Pat. No. 9,064,165; U.S. Pat. No. 9,064,167;
U.S. Pat. No. 9,064,168; U.S. Pat. No. 9,064,254;
U.S. Pat. No. 9,066,032; U.S. Pat. No. 9,070,032;
U.S. Design Pat. No. D716,285;
U.S. Design Pat. No. D723,560;
U.S. Design Pat. No. D730,357;
U.S. Design Pat. No. D730,901;
U.S. Design Pat. No. D730,902;
U.S. Design Pat. No. D733,112;
U.S. Design Pat. No. D734,339;
International Publication No. 2013/163789;
International Publication No. 2013/173985;
International Publication No. 2014/019130;
International Publication No. 2014/110495;
U.S. Patent Application Publication No. 2008/0185432;
U.S. Patent Application Publication No. 2009/0134221;
U.S. Patent Application Publication No. 2010/0177080;
U.S. Patent Application Publication No. 2010/0177076;
U.S. Patent Application Publication No. 2010/0177707;
U.S. Patent Application Publication No. 2010/0177749;
U.S. Patent Application Publication No. 2010/0265880;
U.S. Patent Application Publication No. 2011/0202554;
U.S. Patent Application Publication No. 2012/0111946;
U.S. Patent Application Publication No. 2012/0168511;
U.S. Patent Application Publication No. 2012/0168512;
U.S. Patent Application Publication No. 2012/0193423;
U.S. Patent Application Publication No. 2012/0203647;
U.S. Patent Application Publication No. 2012/0223141;
U.S. Patent Application Publication No. 2012/0228382;
U.S. Patent Application Publication No. 2012/0248188;
U.S. Patent Application Publication No. 2013/0043312;
U.S. Patent Application Publication No. 2013/0082104;
U.S. Patent Application Publication No. 2013/0175341;
U.S. Patent Application Publication No. 2013/0175343;
U.S. Patent Application Publication No. 2013/0257744;
U.S. Patent Application Publication No. 2013/0257759;
U.S. Patent Application Publication No. 2013/0270346;
U.S. Patent Application Publication No. 2013/0287258;
U.S. Patent Application Publication No. 2013/0292475;
U.S. Patent Application Publication No. 2013/0292477;
U.S. Patent Application Publication No. 2013/0293539;
U.S. Patent Application Publication No. 2013/0293540;
U.S. Patent Application Publication No. 2013/0306728;
U.S. Patent Application Publication No. 2013/0306731;
U.S. Patent Application Publication No. 2013/0307964;
U.S. Patent Application Publication No. 2013/0308625;
U.S. Patent Application Publication No. 2013/0313324;
U.S. Patent Application Publication No. 2013/0313325;
U.S. Patent Application Publication No. 2013/0342717;
U.S. Patent Application Publication No. 2014/0001267;
U.S. Patent Application Publication No. 2014/0008439;
U.S. Patent Application Publication No. 2014/0025584;
U.S. Patent Application Publication No. 2014/0034734;
U.S. Patent Application Publication No. 2014/0036848;
U.S. Patent Application Publication No. 2014/0039693;
U.S. Patent Application Publication No. 2014/0042814;
U.S. Patent Application Publication No. 2014/0049120;
U.S. Patent Application Publication No. 2014/0049635;
U.S. Patent Application Publication No. 2014/0061306;
U.S. Patent Application Publication No. 2014/0063289;
U.S. Patent Application Publication No. 2014/0066136;
U.S. Patent Application Publication No. 2014/0067692;
U.S. Patent Application Publication No. 2014/0070005;
U.S. Patent Application Publication No. 2014/0071840;
U.S. Patent Application Publication No. 2014/0074746;
U.S. Patent Application Publication No. 2014/0076974;
U.S. Patent Application Publication No. 2014/0078341;
U.S. Patent Application Publication No. 2014/0078345;
U.S. Patent Application Publication No. 2014/0097249;
U.S. Patent Application Publication No. 2014/0098792;
U.S. Patent Application Publication No. 2014/0100813;
U.S. Patent Application Publication No. 2014/0103115;
U.S. Patent Application Publication No. 2014/0104413;
U.S. Patent Application Publication No. 2014/0104414;
U.S. Patent Application Publication No. 2014/0104416;
U.S. Patent Application Publication No. 2014/0104451;
U.S. Patent Application Publication No. 2014/0106594;
U.S. Patent Application Publication No. 2014/0106725;
U.S. Patent Application Publication No. 2014/0108010;
U.S. Patent Application Publication No. 2014/0108402;
U.S. Patent Application Publication No. 2014/0110485;
U.S. Patent Application Publication No. 2014/0114530;
U.S. Patent Application Publication No. 2014/0124577;
U.S. Patent Application Publication No. 2014/0124579;
U.S. Patent Application Publication No. 2014/0125842;
U.S. Patent Application Publication No. 2014/0125853;
U.S. Patent Application Publication No. 2014/0125999;
U.S. Patent Application Publication No. 2014/0129378;
U.S. Patent Application Publication No. 2014/0131438;
U.S. Patent Application Publication No. 2014/0131441;
U.S. Patent Application Publication No. 2014/0131443;
U.S. Patent Application Publication No. 2014/0131444;
U.S. Patent Application Publication No. 2014/0131445;
U.S. Patent Application Publication No. 2014/0131448;
U.S. Patent Application Publication No. 2014/0133379;
U.S. Patent Application Publication No. 2014/0136208;
U.S. Patent Application Publication No. 2014/0140585;
U.S. Patent Application Publication No. 2014/0151453;
U.S. Patent Application Publication No. 2014/0152882;
U.S. Patent Application Publication No. 2014/0158770;
U.S. Patent Application Publication No. 2014/0159869;
U.S. Patent Application Publication No. 2014/0166755;
U.S. Patent Application Publication No. 2014/0166759;
U.S. Patent Application Publication No. 2014/0168787;
U.S. Patent Application Publication No. 2014/0175165;
U.S. Patent Application Publication No. 2014/0175172;
U.S. Patent Application Publication No. 2014/0191644;
U.S. Patent Application Publication No. 2014/0191913;
U.S. Patent Application Publication No. 2014/0197238;
U.S. Patent Application Publication No. 2014/0197239;
U.S. Patent Application Publication No. 2014/0197304;
U.S. Patent Application Publication No. 2014/0214631;
U.S. Patent Application Publication No. 2014/0217166;
U.S. Patent Application Publication No. 2014/0217180;
U.S. Patent Application Publication No. 2014/0231500;
U.S. Patent Application Publication No. 2014/0232930;
U.S. Patent Application Publication No. 2014/0247315;
U.S. Patent Application Publication No. 2014/0263493;
U.S. Patent Application Publication No. 2014/0263645;
U.S. Patent Application Publication No. 2014/0267609;
U.S. Patent Application Publication No. 2014/0270196;
U.S. Patent Application Publication No. 2014/0270229;
U.S. Patent Application Publication No. 2014/0278387;
U.S. Patent Application Publication No. 2014/0278391;
U.S. Patent Application Publication No. 2014/0282210;
U.S. Patent Application Publication No. 2014/0284384;

U.S. Patent Application Publication No. 2014/0288933;
U.S. Patent Application Publication No. 2014/0297058;
U.S. Patent Application Publication No. 2014/0299665;
U.S. Patent Application Publication No. 2014/0312121;
U.S. Patent Application Publication No. 2014/0319220;
U.S. Patent Application Publication No. 2014/0319221;
U.S. Patent Application Publication No. 2014/0326787;
U.S. Patent Application Publication No. 2014/0332590;
U.S. Patent Application Publication No. 2014/0344943;
U.S. Patent Application Publication No. 2014/0346233;
U.S. Patent Application Publication No. 2014/0351317;
U.S. Patent Application Publication No. 2014/0353373;
U.S. Patent Application Publication No. 2014/0361073;
U.S. Patent Application Publication No. 2014/0361082;
U.S. Patent Application Publication No. 2014/0362184;
U.S. Patent Application Publication No. 2014/0363015;
U.S. Patent Application Publication No. 2014/0369511;
U.S. Patent Application Publication No. 2014/0374483;
U.S. Patent Application Publication No. 2014/0374485;
U.S. Patent Application Publication No. 2015/0001301;
U.S. Patent Application Publication No. 2015/0001304;
U.S. Patent Application Publication No. 2015/0003673;
U.S. Patent Application Publication No. 2015/0009338;
U.S. Patent Application Publication No. 2015/0009610;
U.S. Patent Application Publication No. 2015/0014416;
U.S. Patent Application Publication No. 2015/0021397;
U.S. Patent Application Publication No. 2015/0028102;
U.S. Patent Application Publication No. 2015/0028103;
U.S. Patent Application Publication No. 2015/0028104;
U.S. Patent Application Publication No. 2015/0029002;
U.S. Patent Application Publication No. 2015/0032709;
U.S. Patent Application Publication No. 2015/0039309;
U.S. Patent Application Publication No. 2015/0039878;
U.S. Patent Application Publication No. 2015/0040378;
U.S. Patent Application Publication No. 2015/0048168;
U.S. Patent Application Publication No. 2015/0049347;
U.S. Patent Application Publication No. 2015/0051992;
U.S. Patent Application Publication No. 2015/0053766;
U.S. Patent Application Publication No. 2015/0053768;
U.S. Patent Application Publication No. 2015/0053769;
U.S. Patent Application Publication No. 2015/0060544;
U.S. Patent Application Publication No. 2015/0062366;
U.S. Patent Application Publication No. 2015/0063215;
U.S. Patent Application Publication No. 2015/0063676;
U.S. Patent Application Publication No. 2015/0069130;
U.S. Patent Application Publication No. 2015/0071819;
U.S. Patent Application Publication No. 2015/0083800;
U.S. Patent Application Publication No. 2015/0086114;
U.S. Patent Application Publication No. 2015/0088522;
U.S. Patent Application Publication No. 2015/0096872;
U.S. Patent Application Publication No. 2015/0099557;
U.S. Patent Application Publication No. 2015/0100196;
U.S. Patent Application Publication No. 2015/0102109;
U.S. Patent Application Publication No. 2015/0115035;
U.S. Patent Application Publication No. 2015/0127791;
U.S. Patent Application Publication No. 2015/0128116;
U.S. Patent Application Publication No. 2015/0129659;
U.S. Patent Application Publication No. 2015/0133047;
U.S. Patent Application Publication No. 2015/0134470;
U.S. Patent Application Publication No. 2015/0136851;
U.S. Patent Application Publication No. 2015/0136854;
U.S. Patent Application Publication No. 2015/0142492;
U.S. Patent Application Publication No. 2015/0144692;
U.S. Patent Application Publication No. 2015/0144698;
U.S. Patent Application Publication No. 2015/0144701;
U.S. Patent Application Publication No. 2015/0149946;
U.S. Patent Application Publication No. 2015/0161429;
U.S. Patent Application Publication No. 2015/0169925;
U.S. Patent Application Publication No. 2015/0169929;
U.S. Patent Application Publication No. 2015/0178523;
U.S. Patent Application Publication No. 2015/0178534;
U.S. Patent Application Publication No. 2015/0178535;
U.S. Patent Application Publication No. 2015/0178536;
U.S. Patent Application Publication No. 2015/0178537;
U.S. Patent Application Publication No. 2015/0181093;
U.S. Patent Application Publication No. 2015/0181109;
U.S. patent application Ser. No. 13/367,978 for a Laser Scanning Module Employing an Elastomeric U-Hinge Based Laser Scanning Assembly, filed Feb. 7, 2012 (Feng et al.);
U.S. patent application Ser. No. 29/458,405 for an Electronic Device, filed Jun. 19, 2013 (Fitch et al.);
U.S. patent application Ser. No. 29/459,620 for an Electronic Device Enclosure, filed Jul. 2, 2013 (London et al.);
U.S. patent application Ser. No. 29/468,118 for an Electronic Device Case, filed Sep. 26, 2013 (Oberpriller et al.);
U.S. patent application Ser. No. 14/150,393 for Indicia-reader Having Unitary Construction Scanner, filed Jan. 8, 2014 (Colavito et al.);
U.S. patent application Ser. No. 14/200,405 for Indicia Reader for Size-Limited Applications filed Mar. 7, 2014 (Feng et al.);
U.S. patent application Ser. No. 14/231,898 for Hand-Mounted Indicia-Reading Device with Finger Motion Triggering filed Apr. 1, 2014 (Van Horn et al.);
U.S. patent application Ser. No. 29/486,759 for an Imaging Terminal, filed Apr. 2, 2014 (Oberpriller et al.);
U.S. patent application Ser. No. 14/257,364 for Docking System and Method Using Near Field Communication filed Apr. 21, 2014 (Showering);
U.S. patent application Ser. No. 14/264,173 for Autofocus Lens System for Indicia Readers filed Apr. 29, 2014 (Ackley et al.);
U.S. patent application Ser. No. 14/277,337 for MULTIPURPOSE OPTICAL READER, filed May 14, 2014 (Jovanovski et al.);
U.S. patent application Ser. No. 14/283,282 for TERMINAL HAVING ILLUMINATION AND FOCUS CONTROL filed May 21, 2014 (Liu et al.);
U.S. patent application Ser. No. 14/327,827 for a MOBILE-PHONE ADAPTER FOR ELECTRONIC TRANSACTIONS, filed Jul. 10, 2014 (Hejl);
U.S. patent application Ser. No. 14/334,934 for a SYSTEM AND METHOD FOR INDICIA VERIFICATION, filed Jul. 18, 2014 (Hejl);
U.S. patent application Ser. No. 14/339,708 for LASER SCANNING CODE SYMBOL READING SYSTEM, filed Jul. 24, 2014 (Xian et al.);
U.S. patent application Ser. No. 14/340,627 for an AXIALLY REINFORCED FLEXIBLE SCAN ELEMENT, filed Jul. 25, 2014 (Rueblinger et al.);
U.S. patent application Ser. No. 14/446,391 for MULTIFUNCTION POINT OF SALE APPARATUS WITH OPTICAL SIGNATURE CAPTURE filed Jul. 30, 2014 (Good et al.);
U.S. patent application Ser. No. 14/452,697 for INTERACTIVE INDICIA READER, filed Aug. 6, 2014 (Todeschini);
U.S. patent application Ser. No. 14/453,019 for DIMENSIONING SYSTEM WITH GUIDED ALIGNMENT, filed Aug. 6, 2014 (Li et al.);
U.S. patent application Ser. No. 14/462,801 for MOBILE COMPUTING DEVICE WITH DATA COGNITION SOFTWARE, filed on Aug. 19, 2014 (Todeschini et al.);

U.S. patent application Ser. No. 14/483,056 for VARIABLE DEPTH OF FIELD BARCODE SCANNER filed Sep. 10, 2014 (McCloskey et al.);

U.S. patent application Ser. No. 14/513,808 for IDENTIFYING INVENTORY ITEMS IN A STORAGE FACILITY filed Oct. 14, 2014 (Singel et al.);

U.S. patent application Ser. No. 14/519,195 for HANDHELD DIMENSIONING SYSTEM WITH FEEDBACK filed Oct. 21, 2014 (Laffargue et al.);

U.S. patent application Ser. No. 14/519,179 for DIMENSIONING SYSTEM WITH MULTIPATH INTERFERENCE MITIGATION filed Oct. 21, 2014 (Thuries et al.);

U.S. patent application Ser. No. 14/519,211 for SYSTEM AND METHOD FOR DIMENSIONING filed Oct. 21, 2014 (Ackley et al.);

U.S. patent application Ser. No. 14/519,233 for HANDHELD DIMENSIONER WITH DATA-QUALITY INDICATION filed Oct. 21, 2014 (Laffargue et al.);

U.S. patent application Ser. No. 14/519,249 for HANDHELD DIMENSIONING SYSTEM WITH MEASUREMENT-CONFORMANCE FEEDBACK filed Oct. 21, 2014 (Ackley et al.);

U.S. patent application Ser. No. 14/527,191 for METHOD AND SYSTEM FOR RECOGNIZING SPEECH USING WILDCARDS IN AN EXPECTED RESPONSE filed Oct. 29, 2014 (Braho et al.);

U.S. patent application Ser. No. 14/529,563 for ADAPTABLE INTERFACE FOR A MOBILE COMPUTING DEVICE filed Oct. 31, 2014 (Schoon et al.);

U.S. patent application Ser. No. 14/529,857 for BARCODE READER WITH SECURITY FEATURES filed Oct. 31, 2014 (Todeschini et al.);

U.S. patent application Ser. No. 14/398,542 for PORTABLE ELECTRONIC DEVICES HAVING A SEPARATE LOCATION TRIGGER UNIT FOR USE IN CONTROLLING AN APPLICATION UNIT filed Nov. 3, 2014 (Bian et al.);

U.S. patent application Ser. No. 14/531,154 for DIRECTING AN INSPECTOR THROUGH AN INSPECTION filed Nov. 3, 2014 (Miller et al.);

U.S. patent application Ser. No. 14/533,319 for BARCODE SCANNING SYSTEM USING WEARABLE DEVICE WITH EMBEDDED CAMERA filed Nov. 5, 2014 (Todeschini);

U.S. patent application Ser. No. 14/535,764 for CONCATENATED EXPECTED RESPONSES FOR SPEECH RECOGNITION filed Nov. 7, 2014 (Braho et al.);

U.S. patent application Ser. No. 14/568,305 for AUTO-CONTRAST VIEWFINDER FOR AN INDICIA READER filed Dec. 12, 2014 (Todeschini);

U.S. patent application Ser. No. 14/573,022 for DYNAMIC DIAGNOSTIC INDICATOR GENERATION filed Dec. 17, 2014 (Goldsmith);

U.S. patent application Ser. No. 14/578,627 for SAFETY SYSTEM AND METHOD filed Dec. 22, 2014 (Ackley et al.);

U.S. patent application Ser. No. 14/580,262 for MEDIA GATE FOR THERMAL TRANSFER PRINTERS filed Dec. 23, 2014 (Bowles);

U.S. patent application Ser. No. 14/590,024 for SHELVING AND PACKAGE LOCATING SYSTEMS FOR DELIVERY VEHICLES filed Jan. 6, 2015 (Payne);

U.S. patent application Ser. No. 14/596,757 for SYSTEM AND METHOD FOR DETECTING BARCODE PRINTING ERRORS filed Jan. 14, 2015 (Ackley);

U.S. patent application Ser. No. 14/416,147 for OPTICAL READING APPARATUS HAVING VARIABLE SETTINGS filed Jan. 21, 2015 (Chen et al.);

U.S. patent application Ser. No. 14/614,706 for DEVICE FOR SUPPORTING AN ELECTRONIC TOOL ON A USER'S HAND filed Feb. 5, 2015 (Oberpriller et al.);

U.S. patent application Ser. No. 14/614,796 for CARGO APPORTIONMENT TECHNIQUES filed Feb. 5, 2015 (Morton et al.);

U.S. patent application Ser. No. 29/516,892 for TABLE COMPUTER filed Feb. 6, 2015 (Bidwell et al.);

U.S. patent application Ser. No. 14/619,093 for METHODS FOR TRAINING A SPEECH RECOGNITION SYSTEM filed Feb. 11, 2015 (Pecorari);

U.S. patent application Ser. No. 14/628,708 for DEVICE, SYSTEM, AND METHOD FOR DETERMINING THE STATUS OF CHECKOUT LANES filed Feb. 23, 2015 (Todeschini);

U.S. patent application Ser. No. 14/630,841 for TERMINAL INCLUDING IMAGING ASSEMBLY filed Feb. 25, 2015 (Gomez et al.);

U.S. patent application Ser. No. 14/635,346 for SYSTEM AND METHOD FOR RELIABLE STORE-AND-FORWARD DATA HANDLING BY ENCODED INFORMATION READING TERMINALS filed Mar. 2, 2015 (Sevier);

U.S. patent application Ser. No. 29/519,017 for SCANNER filed Mar. 2, 2015 (Zhou et al.);

U.S. patent application Ser. No. 14/405,278 for DESIGN PATTERN FOR SECURE STORE filed Mar. 9, 2015 (Zhu et al.);

U.S. patent application Ser. No. 14/660,970 for DECODABLE INDICIA READING TERMINAL WITH COMBINED ILLUMINATION filed Mar. 18, 2015 (Kearney et al.);

U.S. patent application Ser. No. 14/661,013 for REPROGRAMMING SYSTEM AND METHOD FOR DEVICES INCLUDING PROGRAMMING SYMBOL filed Mar. 18, 2015 (Soule et al.);

U.S. patent application Ser. No. 14/662,922 for MULTIFUNCTION POINT OF SALE SYSTEM filed Mar. 19, 2015 (Van Horn et al.);

U.S. patent application Ser. No. 14/663,638 for VEHICLE MOUNT COMPUTER WITH CONFIGURABLE IGNITION SWITCH BEHAVIOR filed Mar. 20, 2015 (Davis et al.);

U.S. patent application Ser. No. 14/664,063 for METHOD AND APPLICATION FOR SCANNING A BARCODE WITH A SMART DEVICE WHILE CONTINUOUSLY RUNNING AND DISPLAYING AN APPLICATION ON THE SMART DEVICE DISPLAY filed Mar. 20, 2015 (Todeschini);

U.S. patent application Ser. No. 14/669,280 for TRANSFORMING COMPONENTS OF A WEB PAGE TO VOICE PROMPTS filed Mar. 26, 2015 (Funyak et al.);

U.S. patent application Ser. No. 14/674,329 for AIMER FOR BARCODE SCANNING filed Mar. 31, 2015 (Bidwell);

U.S. patent application Ser. No. 14/676,109 for INDICIA READER filed Apr. 1, 2015 (Huck);

U.S. patent application Ser. No. 14/676,327 for DEVICE MANAGEMENT PROXY FOR SECURE DEVICES filed Apr. 1, 2015 (Yeakley et al.);

U.S. patent application Ser. No. 14/676,898 for NAVIGATION SYSTEM CONFIGURED TO INTEGRATE MOTION SENSING DEVICE INPUTS filed Apr. 2, 2015 (Showering);

U.S. patent application Ser. No. 14/679,275 for DIMENSIONING SYSTEM CALIBRATION SYSTEMS AND METHODS filed Apr. 6, 2015 (Laffargue et al.);

U.S. patent application Ser. No. 29/523,098 for HANDLE FOR A TABLET COMPUTER filed Apr. 7, 2015 (Bidwell et al.);

U.S. patent application Ser. No. 14/682,615 for SYSTEM AND METHOD FOR POWER MANAGEMENT OF MOBILE DEVICES filed Apr. 9, 2015 (Murawski et al.);

U.S. patent application Ser. No. 14/686,822 for MULTIPLE PLATFORM SUPPORT SYSTEM AND METHOD filed Apr. 15, 2015 (Qu et al.);

U.S. patent application Ser. No. 14/687,289 for SYSTEM FOR COMMUNICATION VIA A PERIPHERAL HUB filed Apr. 15, 2015 (Kohtz et al.);

U.S. patent application Ser. No. 29/524,186 for SCANNER filed Apr. 17, 2015 (Zhou et al.);

U.S. patent application Ser. No. 14/695,364 for MEDICATION MANAGEMENT SYSTEM filed Apr. 24, 2015 (Sewell et al.);

U.S. patent application Ser. No. 14/695,923 for SECURE UNATTENDED NETWORK AUTHENTICATION filed Apr. 24, 2015 (Kubler et al.);

U.S. patent application Ser. No. 29/525,068 for TABLET COMPUTER WITH REMOVABLE SCANNING DEVICE filed Apr. 27, 2015 (Schulte et al.);

U.S. patent application Ser. No. 14/699,436 for SYMBOL READING SYSTEM HAVING PREDICTIVE DIAGNOSTICS filed Apr. 29, 2015 (Nahill et al.);

U.S. patent application Ser. No. 14/702,110 for SYSTEM AND METHOD FOR REGULATING BARCODE DATA INJECTION INTO A RUNNING APPLICATION ON A SMART DEVICE filed May 1, 2015 (Todeschini et al.);

U.S. patent application Ser. No. 14/702,979 for TRACKING BATTERY CONDITIONS filed May 4, 2015 (Young et al.);

U.S. patent application Ser. No. 14/704,050 for INTERMEDIATE LINEAR POSITIONING filed May 5, 2015 (Charpentier et al.);

U.S. patent application Ser. No. 14/705,012 for HANDS-FREE HUMAN MACHINE INTERFACE RESPONSIVE TO A DRIVER OF A VEHICLE filed May 6, 2015 (Fitch et al.);

U.S. patent application Ser. No. 14/705,407 for METHOD AND SYSTEM TO PROTECT SOFTWARE-BASED NETWORK-CONNECTED DEVICES FROM ADVANCED PERSISTENT THREAT filed May 6, 2015 (Hussey et al.);

U.S. patent application Ser. No. 14/707,037 for SYSTEM AND METHOD FOR DISPLAY OF INFORMATION USING A VEHICLE-MOUNT COMPUTER filed May 8, 2015 (Chamberlin);

U.S. patent application Ser. No. 14/707,123 for APPLICATION INDEPENDENT DEX/UCS INTERFACE filed May 8, 2015 (Pape);

U.S. patent application Ser. No. 14/707,492 for METHOD AND APPARATUS FOR READING OPTICAL INDICIA USING A PLURALITY OF DATA SOURCES filed May 8, 2015 (Smith et al.);

U.S. patent application Ser. No. 14/710,666 for PRE-PAID USAGE SYSTEM FOR ENCODED INFORMATION READING TERMINALS filed May 13, 2015 (Smith);

U.S. patent application Ser. No. 29/526,918 for CHARGING BASE filed May 14, 2015 (Fitch et al.);

U.S. patent application Ser. No. 14/715,672 for AUGUMENTED REALITY ENABLED HAZARD DISPLAY filed May 19, 2015 (Venkatesha et al.);

U.S. patent application Ser. No. 14/715,916 for EVALUATING IMAGE VALUES filed May 19, 2015 (Ackley);

U.S. patent application Ser. No. 14/722,608 for INTERACTIVE USER INTERFACE FOR CAPTURING A DOCUMENT IN AN IMAGE SIGNAL filed May 27, 2015 (Showering et al.);

U.S. patent application Ser. No. 29/528,165 for IN-COUNTER BARCODE SCANNER filed May 27, 2015 (Oberpriller et al.);

U.S. patent application Ser. No. 14/724,134 for ELECTRONIC DEVICE WITH WIRELESS PATH SELECTION CAPABILITY filed May 28, 2015 (Wang et al.);

U.S. patent application Ser. No. 14/724,849 for METHOD OF PROGRAMMING THE DEFAULT CABLE INTERFACE SOFTWARE IN AN INDICIA READING DEVICE filed May 29, 2015 (Barten);

U.S. patent application Ser. No. 14/724,908 for IMAGING APPARATUS HAVING IMAGING ASSEMBLY filed May 29, 2015 (Barber et al.);

U.S. patent application Ser. No. 14/725,352 for APPARATUS AND METHODS FOR MONITORING ONE OR MORE PORTABLE DATA TERMINALS (Caballero et al.);

U.S. patent application Ser. No. 29/528,590 for ELECTRONIC DEVICE filed May 29, 2015 (Fitch et al.);

U.S. patent application Ser. No. 29/528,890 for MOBILE COMPUTER HOUSING filed Jun. 2, 2015 (Fitch et al.);

U.S. patent application Ser. No. 14/728,397 for DEVICE MANAGEMENT USING VIRTUAL INTERFACES CROSS-REFERENCE TO RELATED APPLICATIONS filed Jun. 2, 2015 (Caballero);

U.S. patent application Ser. No. 14/732,870 for DATA COLLECTION MODULE AND SYSTEM filed Jun. 8, 2015 (Powilleit);

U.S. patent application Ser. No. 29/529,441 for INDICIA READING DEVICE filed Jun. 8, 2015 (Zhou et al.);

U.S. patent application Ser. No. 14/735,717 for INDICIA-READING SYSTEMS HAVING AN INTERFACE WITH A USER'S NERVOUS SYSTEM filed Jun. 10, 2015 (Todeschini);

U.S. patent application Ser. No. 14/738,038 for METHOD OF AND SYSTEM FOR DETECTING OBJECT WEIGHING INTERFERENCES filed Jun. 12, 2015 (Amundsen et al.);

U.S. patent application Ser. No. 14/740,320 for TACTILE SWITCH FOR A MOBILE ELECTRONIC DEVICE filed Jun. 16, 2015 (Bandringa);

U.S. patent application Ser. No. 14/740,373 for CALIBRATING A VOLUME DIMENSIONER filed Jun. 16, 2015 (Ackley et al.);

U.S. patent application Ser. No. 14/742,818 for INDICIA READING SYSTEM EMPLOYING DIGITAL GAIN CONTROL filed Jun. 18, 2015 (Xian et al.);

U.S. patent application Ser. No. 14/743,257 for WIRELESS MESH POINT PORTABLE DATA TERMINAL filed Jun. 18, 2015 (Wang et al.);

U.S. patent application Ser. No. 29/530,600 for CYCLONE filed Jun. 18, 2015 (Vargo et al);

U.S. patent application Ser. No. 14/744,633 for IMAGING APPARATUS COMPRISING IMAGE SENSOR ARRAY HAVING SHARED GLOBAL SHUTTER CIRCUITRY filed Jun. 19, 2015 (Wang);

U.S. patent application Ser. No. 14/744,836 for CLOUD-BASED SYSTEM FOR READING OF DECODABLE INDICIA filed Jun. 19, 2015 (Todeschini et al.);

U.S. patent application Ser. No. 14/745,006 for SELECTIVE OUTPUT OF DECODED MESSAGE DATA filed Jun. 19, 2015 (Todeschini et al.);

U.S. patent application Ser. No. 14/747,197 for OPTICAL PATTERN PROJECTOR filed Jun. 23, 2015 (Thuries et al.);

U.S. patent application Ser. No. 14/747,490 for DUAL-PROJECTOR THREE-DIMENSIONAL SCANNER filed Jun. 23, 2015 (Jovanovski et al.); and U.S. patent application Ser. No. 14/748,446 for CORDLESS INDICIA READER WITH A MULTIFUNCTION COIL FOR WIRELESS CHARGING AND EAS DEACTIVATION, filed Jun. 24, 2015 (Xie et al.).

Example embodiments of the present invention are thus described in relation to managing energy usage by a mobile device.

For clarity and brevity, as well as to avoid unnecessary or unhelpful obfuscating, obscuring, obstructing, or occluding features of an example embodiment, certain intricacies and details, which are known generally to artisans of ordinary skill in related technologies, may have been omitted or discussed in less than exhaustive detail. Any such omissions or discussions are neither necessary for describing example embodiments of the invention, nor particularly relevant to understanding of significant elements, features, functions, and aspects of the example embodiments described herein.

In the specification and/or figures, typical embodiments of the invention have been disclosed. The present invention is not limited to such example embodiments. The use of the term "and/or" includes any and all combinations of one or more of the associated listed items, and the term "or" is used in an inclusive (and not exclusive) sense. The figures are schematic representations and so are not necessarily drawn to scale. Unless otherwise noted, specific terms have been used in a generic and descriptive sense and not for purposes of limitation.

What is claimed is:

1. A method of managing power in a battery powered mobile device, comprising:
    measuring, with a battery monitoring circuit, one or more parameters indicative of a current state of a battery;
    determining, with a processor, the current state of the battery by receiving data representing the measured one or more parameters;
    calculating, with the processor, a battery power factor as a function of the received data;
    comparing, with the processor, the battery power factor to a threshold;
    when the battery power factor exceeds the threshold, identifying, with the processor, a system or process within the mobile device whose power consumption can be reduced; and
    altering or disabling, with the processor, the identified system or process to reduce power consumption.

2. The method according to claim 1, where the identifying is carried out on the basis of an assigned priority of a plurality of systems or processes and selecting a lowest priority system or process that can be converted to a lower power consumption state as the identified system or process.

3. The method according to claim 1, where the determining measuring comprises measuring a battery temperature, battery terminal voltage, and battery current draw.

4. The method according to claim 3, where the battery power factor is calculated by:
    assigning a value to each of the current state of the battery temperature as T;
    assigning a value to the terminal voltage as V;
    assigning a value to the current draw as I; and
    computing the battery power factor as the sum of T, V and I.

5. The method according to claim 1, where the identified system or process comprises a heater element, and where the power consumption is reduced by either deactivating the heater element or causing the heater element to operate at less than 100% heat generation.

6. The method according to claim 1, further comprising:
    repeating the determining, calculating, and comparing;
    identifying a further system or process within the mobile device whose power consumption can be reduced; and
    further reducing the power consumption by altering or disabling the further system or process.

7. The method according to claim 6, where identifying a system and identifying a further system are carried out on the basis of an assigned priority of a plurality of systems or processes and selecting a lowest priority system or process that can be converted to a lower power consumption state as the identified system or process and further identified system or process.

8. The method according to claim 1, further comprising:
    determining that the current battery factor is lower than a prior battery factor by a prescribed amount;
    and upon determining that the current battery factor is lower than the prior battery factor by the prescribed amount, selecting a system or process for restoration to a higher power consumption state; and
    restoring the system or process to a higher power consumption state.

9. The method according to claim 8, where the selecting is carried out on the basis of an assigned priority of a plurality of systems or processes and selecting a higher priority system or process that can be converted to a higher power consumption state as the selected system or process.

10. A battery powered mobile device, comprising:
    a battery;
    a battery monitoring circuit that measures one or more parameters indicative of a current state of the battery;
    a plurality of operational systems and processes forming a part of the mobile device;
    a programmed processor programmed to carry out a process comprising:
        determining a current state of the battery by receiving data representing the one or more parameters from the battery monitoring circuit indicative of the current state of the battery;
        calculating a battery power factor as a function of the received data;
        comparing the battery power factor to a threshold;
        when the battery power factor exceeds the threshold, identifying a system or process within the mobile device whose power consumption can be reduced; and
        altering or disabling the identified system or process to reduce power consumption.

11. The battery powered mobile device according to claim 10, where the identifying is carried out by the processor on the basis of an assigned priority of the plurality of systems or processes and selecting a lowest priority system or process that can be converted to a lower power consumption state as the identified system or process.

12. The battery powered mobile device according to claim 10, where the determining is carried out by the processor on the basis of a battery temperature, battery terminal voltage, and battery current draw as measured by the battery monitor circuit.

13. The battery powered mobile device according to claim 12, where the processor calculates the battery power factor by:
assigning a value to each of the current state of the battery temperature as T;
assigning a value to the terminal voltage as V;
assigning a value to the current draw as I; and
computing the battery power factor as the sum of T, V and I.

14. The battery powered mobile device according to claim 10, where the identified system or process comprises a heater element, and where the processor reduces the power consumption by either deactivating the heater element or causing the heater element to operate at less than 100% heat generation.

15. The battery powered mobile device according to claim 10, where the processor is further programmed to:
repeat the determining, calculating, and comparing;
identify a further system or process within the mobile device whose power consumption can be reduced; and
further reduce the power consumption by altering or disabling the further system or process.

16. The battery powered mobile device according to claim 15, where identifying a system or process and identifying a further system or process are carried out by the processor on the basis of an assigned priority of a plurality of systems or processes and selecting a lowest priority system or process that can be converted to a lower power consumption state as the identified system or process and further identified system or process.

17. The battery powered mobile device according to claim 10, where the processor is further programmed to:
determine that the current battery factor is lower than a prior battery factor by a prescribed amount;
and upon determining that the current battery factor is lower than the prior battery factor by the prescribed amount, select a system or process for restoration to a higher power consumption state; and
restore the selected system or process to a higher power consumption state.

18. The battery powered mobile device according to claim 17, where the selecting is carried out on the basis of an assigned priority of a plurality of systems or processes and selecting a higher priority system or process that can be converted to a higher power consumption state as the selected system or process.

19. A battery powered mobile device, comprising:
a battery;
a battery monitoring circuit that measures battery temperature, battery terminal voltage and battery current draw as an indication of a current state of the battery;
a plurality of operational systems and processes forming a part of the mobile device;
a stored priority table that tabulates an assigned priority of the plurality of systems or processes that can be converted to a lower power consumption state;
a programmed processor programmed to carry out a process comprising:
determining a current state of the battery by receiving data representing the battery temperature, battery terminal voltage, and battery current draw;
calculating a battery power factor by assigning a value to the current state of the battery temperature as T, assigning a value to the terminal voltage as V, assigning a value to the current draw as I, and computing the battery power factor as the sum of T, V and I;
comparing the battery power factor to a threshold;
when the battery power factor exceeds the threshold, identifying a system or process within the mobile device whose power consumption can be reduced by reference to the priority table and selecting a lowest priority system or process that can be converted to a lower power consumption state; and
altering or disabling the identified system or process to reduce power consumption.

20. The battery powered mobile device according to claim 19, where the processor is further programmed to:
determine that the current battery factor is lower than a prior battery factor by a prescribed amount;
and upon determining that the current battery factor is lower than the prior battery factor by the prescribed amount, select a system or process that is operating in a lower power state or disabled for restoration to a higher power consumption state;
where the selecting is carried out by referring to the priority table and selecting a highest priority system or process that can be converted to a higher power consumption state as the selected system or process; and
restore the selected highest priority system or process to the higher power consumption state.

* * * * *